(12) United States Patent
Jung et al.

(10) Patent No.: US 12,143,790 B2
(45) Date of Patent: Nov. 12, 2024

(54) ROTATABLE DISPLAY APPARATUS

(71) Applicant: SAMSUNG ELECTRONICS CO., LTD., Suwon-si (KR)

(72) Inventors: Donghyun Jung, Suwon-si (KR); Jongbae Kim, Suwon-si (KR); Sungjoo Kim, Suwon-si (KR); Dongkyu Park, Suwon-si (KR); Sungha Son, Suwon-si (KR); Youngsang Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 83 days.

(21) Appl. No.: 17/860,766

(22) Filed: Jul. 8, 2022

(65) Prior Publication Data
US 2022/0417662 A1    Dec. 29, 2022

Related U.S. Application Data

(63) Continuation of application No. PCT/KR2022/006077, filed on Apr. 28, 2022.

(30) Foreign Application Priority Data

Jun. 29, 2021   (KR) .......................... 10-2021-0084737

(51) Int. Cl.
*H04R 5/04*     (2006.01)
*H04R 1/02*     (2006.01)
(Continued)

(52) U.S. Cl.
CPC .............. *H04R 5/04* (2013.01); *H04R 1/028* (2013.01); *H04R 3/12* (2013.01); *H04R 5/02* (2013.01);
(Continued)

(58) Field of Classification Search
None
See application file for complete search history.

(56) References Cited

U.S. PATENT DOCUMENTS 8,150,079 B2   4/2012   Maeda et al.
8,879,761 B2   11/2014  Johnson et al.
(Continued)

FOREIGN PATENT DOCUMENTS

CN   111050270 A   4/2020
CN   111580771 A   8/2020
(Continued)

OTHER PUBLICATIONS

English language translation of CN111580771, Aug. 25, 2020, pp. 1-22. (Year: 2020).*
(Continued)

*Primary Examiner* — Paul W Huber
(74) *Attorney, Agent, or Firm* — Sughrue Mion, PLLC

(57) ABSTRACT

A rotatable display apparatus includes a display panel including a rectangular shape, a plurality of speakers provided at an edge of the display panel, a rotating device provided on a rear surface of the display panel and configured to rotate the display panel, a panel rotation detector configured to detect a rotation state of the display panel, an audio signal processor configured to transmit a left audio signal, a right audio signal, and a mixed audio signal to the plurality of speakers based on the rotation state of the display panel, and a mixer provided in the audio signal processor and configured to generate the mixed audio signal by mixing the left audio signal and the right audio signal at a predetermined ratio.

18 Claims, 41 Drawing Sheets

(51) Int. Cl.
*H04R 3/12* (2006.01)
*H04R 5/02* (2006.01)
*H04S 1/00* (2006.01)
*H05K 5/02* (2006.01)

(52) U.S. Cl.
CPC .......... *H04S 1/007* (2013.01); *H05K 5/0234* (2013.01); *H04R 2499/15* (2013.01)

(56) References Cited

U.S. PATENT DOCUMENTS

| | | | |
|---|---|---|---|
| 9,241,217 | B2* | 1/2016 | Rodgers ................ G06F 1/1688 |
| 10,491,985 | B2 | 11/2019 | Lee et al. |
| 10,567,877 | B2 | 2/2020 | Nam et al. |
| 10,820,092 | B2 | 10/2020 | Lee et al. |
| 11,290,832 | B2 | 3/2022 | So et al. |
| 2003/0156075 | A1 | 8/2003 | Motoyama et al. |
| 2006/0161278 | A1 | 7/2006 | Maeda et al. |
| 2006/0227985 | A1 | 10/2006 | Kawanaami |
| 2011/0002487 | A1* | 1/2011 | Panther ................ H04R 5/04 381/300 |
| 2011/0150247 | A1* | 6/2011 | Oliveras ................ G06F 3/165 73/514.16 |
| 2011/0316768 | A1* | 12/2011 | McRae ................ G06F 3/165 381/80 |
| 2013/0038726 | A1 | 2/2013 | Kim |
| 2013/0156203 | A1 | 6/2013 | Choi |
| 2013/0163794 | A1* | 6/2013 | Groves ................ G06F 1/1626 381/303 |
| 2014/0233772 | A1* | 8/2014 | Giustina ................ H04R 5/04 381/306 |
| 2014/0333671 | A1* | 11/2014 | Phang ................ G06F 3/017 345/659 |
| 2016/0192063 | A1 | 6/2016 | Lee et al. |
| 2017/0289723 | A1 | 10/2017 | Yoo et al. |
| 2019/0246208 | A1 | 8/2019 | Nam et al. |
| 2020/0053465 | A1* | 2/2020 | Wang ................ H04R 5/04 |
| 2020/0053500 | A1* | 2/2020 | Tran ................ H04S 7/303 |
| 2020/0100020 | A1 | 3/2020 | Lee et al. |
| 2021/0321209 | A1 | 10/2021 | So et al. |
| 2022/0174445 | A1 | 6/2022 | So et al. |

FOREIGN PATENT DOCUMENTS

| | | |
|---|---|---|
| JP | 2003244786 A | 8/2003 |
| JP | 2005295382 A | 10/2005 |
| JP | 2006-174277 A | 6/2006 |
| JP | 2006-295313 A | 10/2006 |
| JP | 200938605 A | 2/2009 |
| KR | 1020120100158 A | 9/2012 |
| KR | 10-2013-0016906 A | 2/2013 |
| KR | 10-2013-0068862 A | 6/2013 |
| KR | 10-1772397 A | 8/2017 |
| KR | 10-2019-0095789 A | 8/2019 |
| KR | 10-2147214 B1 | 8/2020 |
| KR | 10-2201870 B1 | 1/2021 |
| KR | 10-2239838 B1 | 4/2021 |

OTHER PUBLICATIONS

International Search Report (PCT/ISA/210) issued Aug. 5, 2022 by the International Searching Authority in International Application No. PCT/KR2022/006077.

Written Opinion (PCT/ISA/237) issued Aug. 5, 2022 by the International Searching Authority in International Application No. PCT/KR2022/006077.

Communication issued Sep. 5, 2024 by the European Patent Office in European Patent Application No. 22833381.1.

* cited by examiner

ROTATABLE DISPLAY APPARATUS

CROSS-REFERENCE TO RELATED APPLICATIONS

This application is a bypass continuation application of International Application No. PCT/KR2022/006077, filed on Apr. 28, 2022, which claims priority to Korean Patent Application No. 10-2021-0084737, filed on Jun. 29, 2021 in the Korean Intellectual Property Office, the disclosures of which are incorporated herein by reference in their entireties.

BACKGROUND

1. Field

The disclosure relates generally to a display apparatus, and more particularly, to a rotatable display apparatus.

2. Description of the Related Art

Generally, a display apparatus, for example, a televisions (TV) is formed in a rectangular shape, is used in a state in which the horizontal length is longer than the vertical length, that is, in a horizontal affangement.

Such a display apparatus may include a plurality of speakers to output a sound suitable for a displayed image.

FIG. 1 is a diagram illustrating a display apparatus 100 disposed in a horizontal affangement.

For example, the display apparatus 100 may include two speakers 101 and 102 disposed in the lower surface 110 of the display apparatus as illustrated in FIG. 1.

As illustrated in FIG. 1, when the speakers 101 and 102 are provided in the lower surface of the display apparatus 100, the sound emitted from the speakers 101 and 102 is reflected from the floor to the upper side, such that sound imaging may be substantially matched with the screen. In addition, because two speakers 101 and 102 are disposed on the left side and the right side in the lower surface 110 of the display apparatus 100, a stereo effect may be obtained.

Recently, the number of cases in which a user uses the display apparatus 100 in a vertical arrangement is increasing. Here, the vertical arrangement refers to a case in which the display apparatus 100 is provided in a state in which the horizontal length L1 is shorter than the vertical length L2.

FIG. 2 is a diagram illustrating a display apparatus disposed in a vertical arrangement.

Accordingly, when the display apparatus 100 disposed in the horizontal arrangement is rotated by 90 degrees, the display apparatus 100 is in the vertical arrangement as illustrated in FIG. 2.

As illustrated in FIG. 2, when the conventional display apparatus 100 is disposed in the vertical arrangement, the two speakers 101 and 102 provided in the lower surface 110 of the display apparatus 100 face to the left side. Accordingly, the sound reproduced by the two speakers 101 and 102 is emitted toward the left side of the display apparatus 100.

Then, because the sound is emitted only from the left of the display apparatus, a problem of inconsistency between the screen and the sound image may occur. Also, there is a problem that a stereo effect may not be obtained.

SUMMARY

Provided is a rotatable display apparatus capable of improving sound image localization, minimizing discrepancy between a screen and a sound image, and realizing a stereo effect in response to the rotation of the display apparatus.

In accordance with an aspect of the disclosure, a rotatable display apparatus may include a display panel including a rectangular shape, a plurality of speakers provided at an edge of the display panel, a rotating device provided on a rear surface of the display panel and configured to rotate the display panel, a panel rotation detector configured to detect a rotation state of the display panel, an audio signal processor configured to transmit a left audio signal, a right audio signal, and a mixed audio signal to the plurality of speakers based on the rotation state of the display panel, and a mixer provided in the audio signal processor and configured to generate the mixed audio signal by mixing the left audio signal and the right audio signal at a predetermined ratio.

The mixer may be configured to determine a mixing ratio of the left audio signal and the right audio signal included in the mixed audio signal based on a rotation angle of the display panel.

The audio signal processor may be further configured to, based on the display panel being inclined, output the left audio signal to a speaker positioned at a leftmost side among the plurality of speakers, output the right audio signal to a speaker positioned at a rightmost side among the plurality of speakers, and output the mixed audio signal to remaining speakers of the plurality of speakers.

The audio signal processor may be further configured to, based on the display panel being disposed in a horizontal arrangement or in a vertical arrangement, not transmit the mixed audio signal to the plurality of speakers.

The rotating device may be configured to be driven by a motor.

The plurality of speakers may be symmetrically provided at an upper portion and a lower portion of the display panel.

The plurality of speakers may include a first speaker and a second speaker provided in an upper surface of the display panel, and a third speaker and a fourth speaker provided in a lower surface of the display panel.

Based on the display panel being inclined by rotating the display panel by a predetermined angle in a clockwise direction, the audio signal processor may be further configured to output the left audio signal to the third speaker positioned at a leftmost side, output the right audio signal to the second speaker positioned at a rightmost side, and output the mixed audio signal to the first speaker and the fourth speaker.

The plurality of speakers may include a first speaker and a second speaker provided in a left surface of the display panel, and a third speaker and a fourth speaker provided in a right surface of the display panel.

The plurality of speakers may include a first speaker provided in a left surface of the display panel, a second speaker provided in a right surface of the display panel at a position facing the first speaker, a third speaker provided in a lower surface of the display panel, and a fourth speaker provided in an upper surface of the display panel at a position facing the third speaker.

The plurality of speakers may be asymmetrically provided at an upper portion and a lower portion of the display panel.

The plurality of speakers may include a left speaker provided in a left surface of the display panel, a right speaker provided in a right surface of the display panel, and two lower speakers provided in a lower surface of the display panel.

The audio signal processor may be further configured to, based on the display panel being inclined by rotating the display panel by a predetermined angle in a clockwise direction, transmit an audio signal of a low frequency range to the two lower speakers, and output the mixed audio signal to the left speaker and the right speaker.

The audio signal processor may further include a parametric equalizer (PEQ) storage portion configured to store a plurality of PEQ values, and the audio signal processor may be further configured to apply to a different PEQ value to a speaker provided in a lower surface of the display panel among the plurality of speakers based on a rotation angle of the display panel.

The display panel may be divided into at least two screens, and the audio signal processor may be further configured to transmit audio signals to the plurality of speakers to correspond to the at least two screens.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION OF THE EMBODIMENTS

Various embodiments of the disclosure will hereinafter be described with reference to the accompanying drawings. However, it is to be understood that embodiments of the present disclosure are not limited to the described example embodiments, and include various modifications, equivalents, and/or alternatives according to embodiments of the disclosure. The matters defined herein, such as a detailed construction and elements thereof, are provided to assist in a comprehensive understanding of the present disclosure. Thus, it is apparent that example embodiments may be carried out without those defined matters. Also, well-known functions or constructions are omitted to provide a clear and concise description of example embodiments. Further, dimensions of various elements in the accompanying drawings may be arbitrarily increased or decreased for assisting in a comprehensive understanding.

The terms 'first', 'second', etc. may be used to describe diverse components, but the components are not limited by the terms. The terms may only be used to distinguish one component from the others. For example, without departing from the scope of the present disclosure, a first component may be referred to as a second component, and similarly, a second component may also be referred to as a first component.

The terms used in embodiments of the present disclosure may be construed as commonly known to those skilled in the art unless otherwise defined.

Further, the terms 'leading end', 'rear end', 'upper side', 'lower side', 'top end', 'bottom end', etc. used in the present disclosure are defined with reference to the drawings. However, the shape and position of each component are not limited by the terms.

Hereinafter, embodiments of a rotatable display apparatus according to the disclosure will be described in detail with reference to the accompanying drawings.

Figure 1:
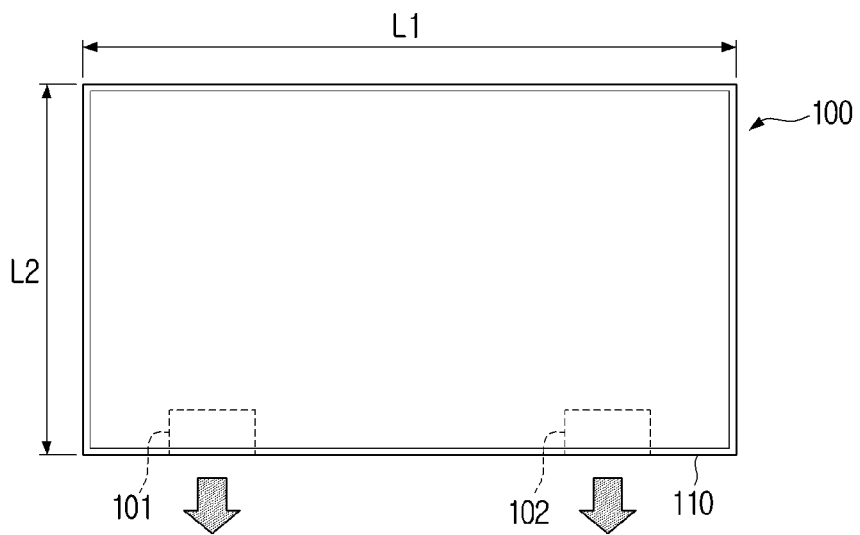
FIG. 1 is a diagram illustrating a display apparatus disposed in a horizontal affangement.
Figure 2:
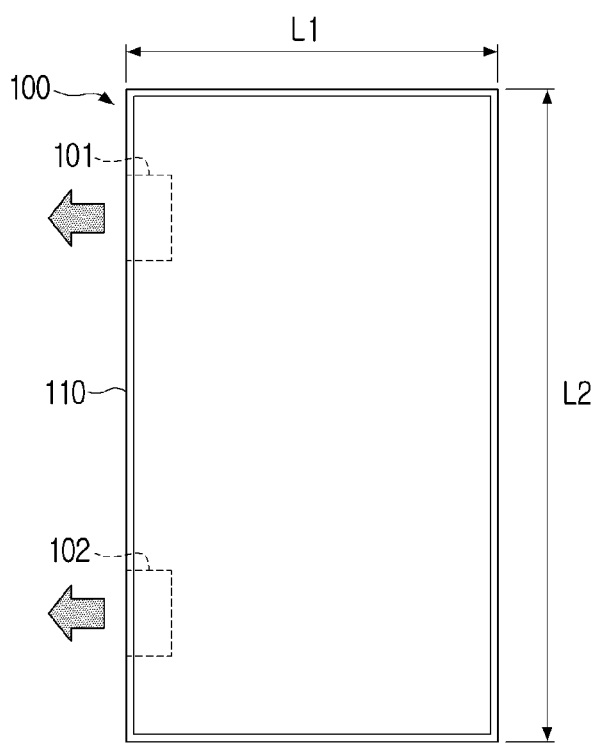
FIG. 2 is a diagram illustrating a display apparatus disposed in a vertical affangement.
Figure 3:
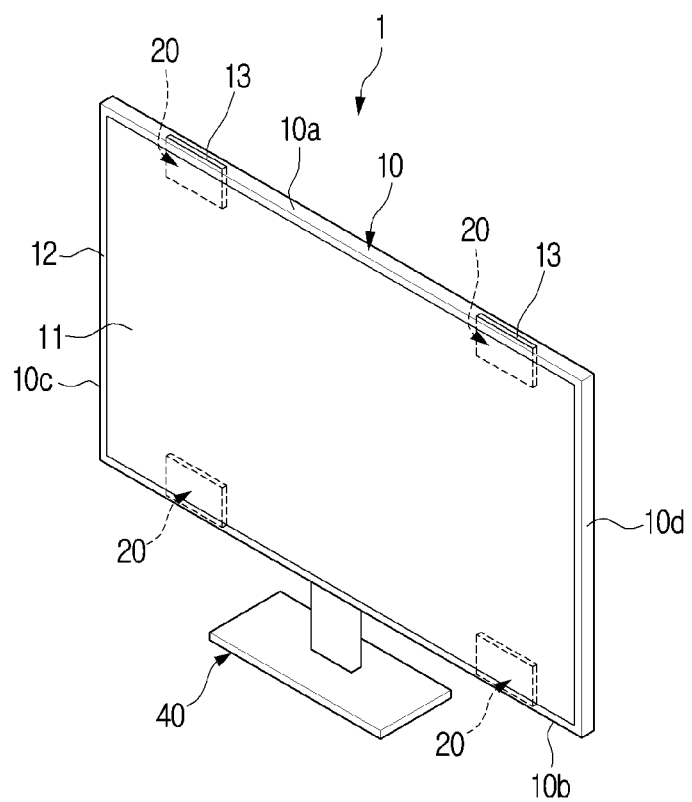
FIG. 3 is a diagram illustrating a rotatable display apparatus according to an embodiment.
Figure 4:
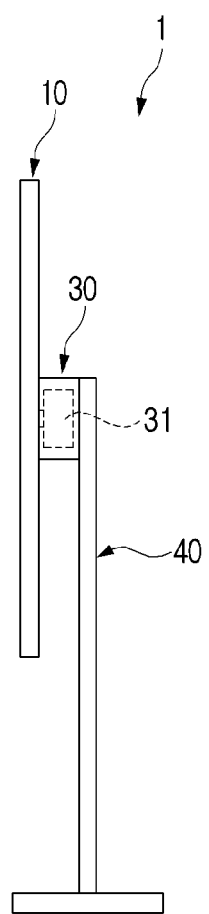
FIG. 4 is a diagram illustrating a rotatable display apparatus according to an embodiment.
Figure 5:
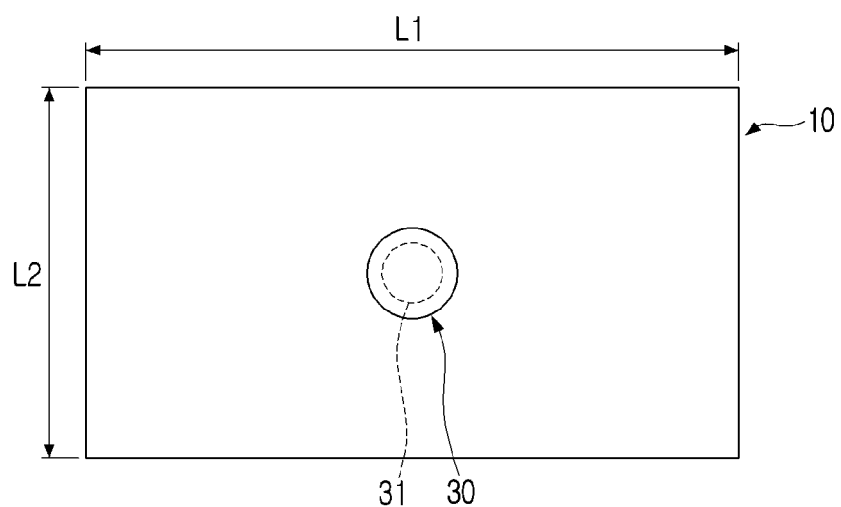
FIG. 5 is a diagram illustrating a rotatable display apparatus according to an embodiment.
Figure 6:
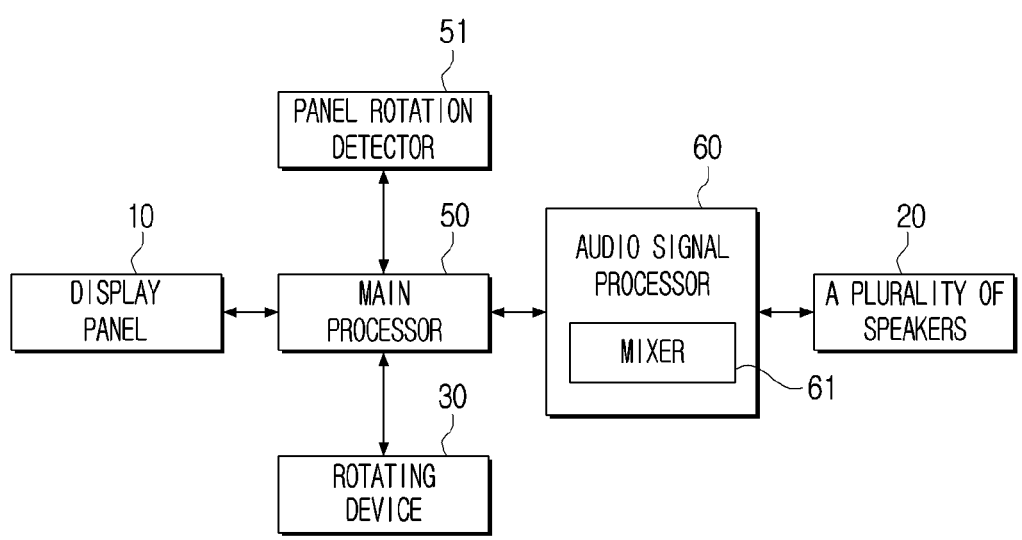
FIG. 6 is a diagram of a rotatable display apparatus according to an embodiment.

FIG. 3 is a diagram illustrating a rotatable display apparatus according to an embodiment. FIG. 4 is a diagram illustrating a rotatable display apparatus according to an embodiment. FIG. 5 is a diagram illustrating a rotatable display apparatus according to an embodiment. FIG. 6 is a diagram of a rotatable display apparatus according to an embodiment.

Referring to FIGS. 3, 4 and 5, a rotatable display apparatus 1 according to an embodiment may include a display panel 10, a plurality of speakers 20, a rotating device 30.

The display panel 10 is formed in a substantially rectangular shape, and is configured to display an image. The display panel 10 may be formed to have a horizontal length L1 longer than a vertical length L2.

A front surface of the display panel 10 may form a screen 11 for displaying an image. A bezel 12 may be provided at an edge of the display panel 10.

An electronic circuit substrate that controls the display panel 10 to display an image and controls the plurality of speakers 20 to emit sound may be disposed inside the display panel 10.

The plurality of speakers 20 may be disposed in the edge of the display panel 10. The plurality of speakers 20 are provided inside the display panel 10 and are not exposed to the outside. A plurality of emission ports 13 through which sounds reproduced by the plurality of speakers 20 are emitted may be formed at the edge of the display panel 10.

The plurality of speakers 20 may be configured to emit a sound corresponding to an image displayed on the display panel 10. Each of the plurality of speakers 20 may include an enclosure and at least one acoustic transducer provided inside the enclosure.

The plurality of speakers 20 may emit sound in various ways. For example, the plurality of speakers 20 may be configured to emit sound in various types, such as a front emission type that emits sound through the front surface of the display panel 10, a down firing emitting type that emits sound through the lower surface of the display panel 10, a slit emission type that emits sound through a slit, and the like.

The plurality of speakers 20 may be vertically symmetrical and horizontally symmetrical in the display panel 10. In detail, the plurality of speakers 20 may be disposed to be symmetrical with respect to a vertical line passing through the center C (see FIG. 7A) of the display panel 10. Also, the plurality of speakers 20 may be symmetrically disposed on the upper surface 10a and the lower surface 10b of the display panel 10.

For example, a case in which the plurality of speakers 20 are disposed in the display panel 10 horizontally symmetrically and vertically symmetrically may include a case in which two speakers 20 are disposed in the upper surface 10a of the display panel 10 and two speakers 20 are disposed in the lower surface 10b of the display panel 10 as illustrated in FIG. 3. In this case, no speakers are disposed on the left surface 10c and the right surface 10d of the display panel 10.

Figure 8A:
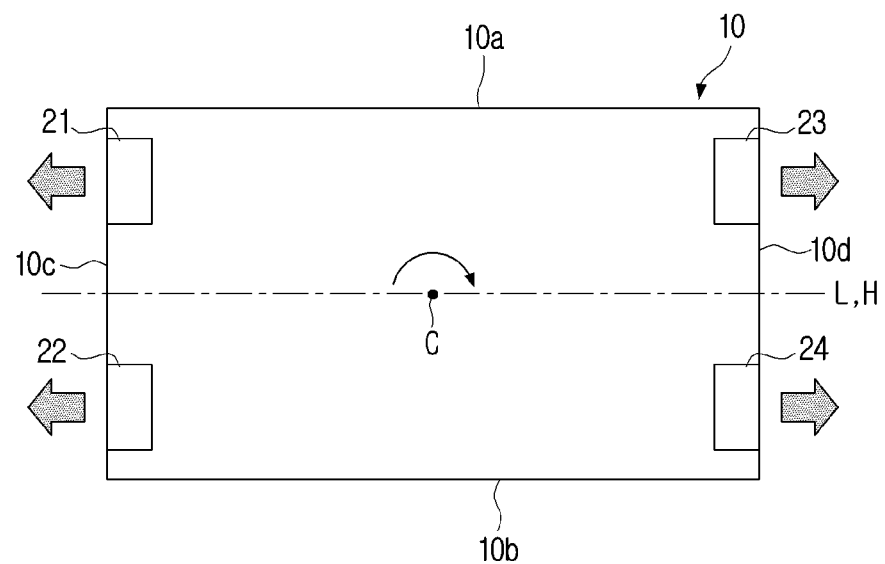
FIG. 8A is a diagram illustrating a state in which a rotatable display apparatus having four speakers is disposed in a horizontal arrangement according to an embodiment.

As another example, the case in which the plurality of speakers 20 are disposed in the display panel 10 horizontally symmetrically and vertically symmetrically may include a case in which two speakers 21 and 22 are disposed in the left surface 10c of the display panel 10 and two speakers 23 and 24 are disposed in the right surface 10d of the display panel 10 as illustrated in FIG. 8A. In this case, no speakers are disposed on the upper surface 10a and the lower surface 10b of the display panel 10.

Figure 9A:
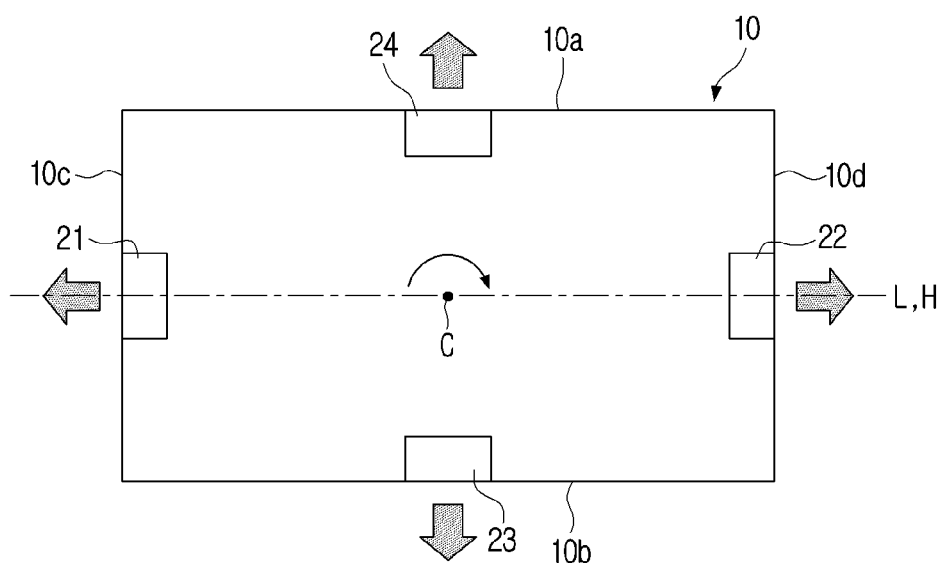
FIG. 9A is a diagram illustrating a state in which a rotatable display apparatus having four speakers is disposed in a horizontal arrangement according to an embodiment.

As another example, the case in which the plurality of speakers 20 are disposed in the display panel 10 horizontally symmetrically and vertically symmetrically may include a case in which one speaker 21 is disposed in the center of the left surface 10c of the display panel 10, one speaker 22 is disposed in the center of the right surface 10d, one speaker 24 is disposed in the center of the upper surface 10a, and one speaker is disposed in the lower surface 10b as illustrated in FIG. 9A.

Alternatively, the plurality of speakers 20 may be disposed in the display panel 10 horizontally symmetrically and vertically asymmetrically. In detail, the plurality of speakers 20 may be disposed to be symmetrical with respect to a vertical line passing through the center C of the display panel 10. Also, the plurality of speakers 20 may be asymmetrically disposed on the upper surface 10a and the lower surface 10b of the display panel 10.

Figure 10A:
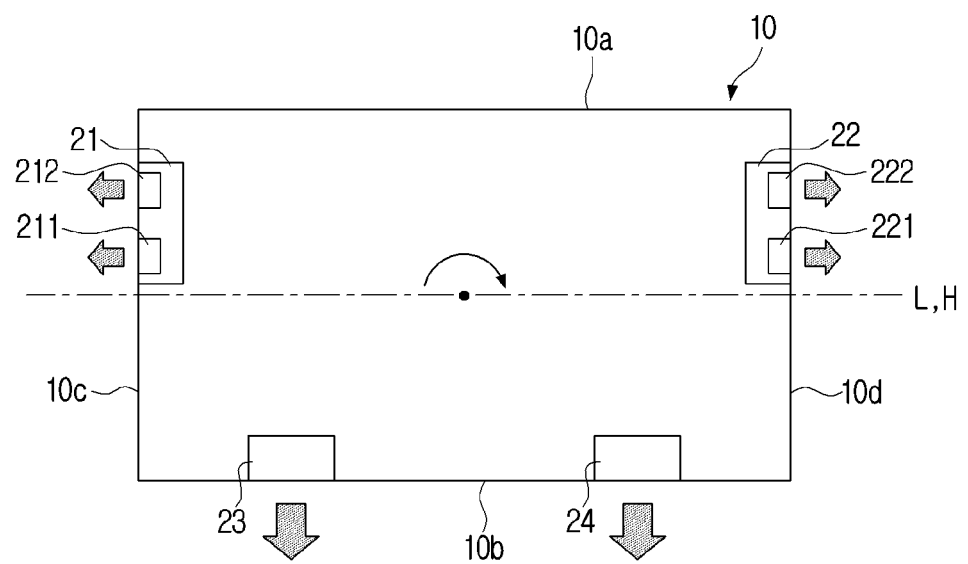
FIG. 10A is a diagram illustrating a state in which a rotatable display apparatus having four speakers according to an embodiment is disposed in a horizontal arrangement.

For example, a case in which the plurality of speakers 20 are disposed in the display panel 10 horizontally symmetrically and vertically asymmetrically may include a case in which one speaker 21 is disposed in the left surface 10c of the display panel 10, one speaker 22 is disposed in the right surface 10d, and two speakers 23 and 24 are disposed in the lower surface 10b as illustrated in FIG. 10A. In this case, because a speaker is not disposed in the upper surface 10a of the display panel 10, the plurality of speakers 23 and 24 are vertically asymmetrical.

Figure 13A:
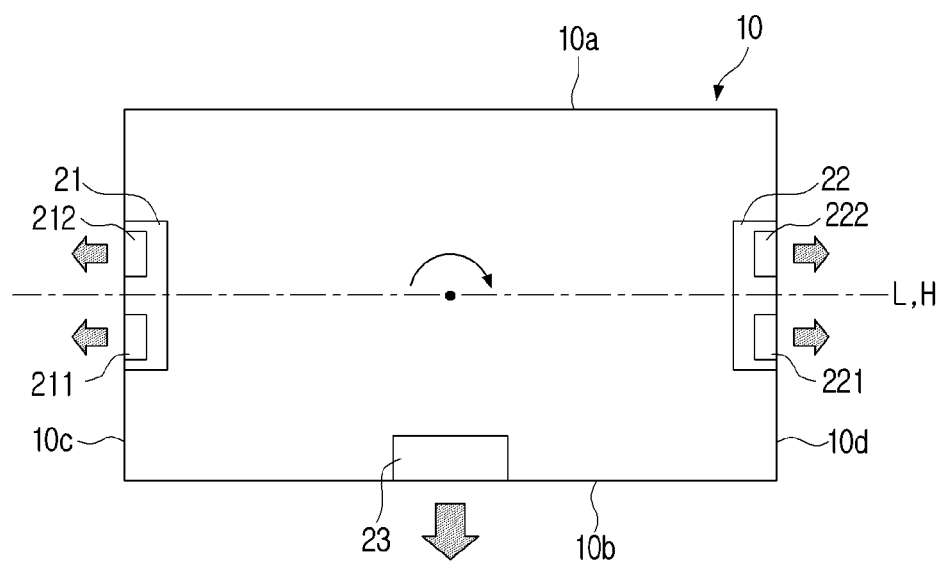
FIG. 13A is a diagram illustrating a state in which a rotatable display apparatus having three speakers is disposed in a horizontal arrangement according to an embodiment.

As another example, the case in which the plurality of speakers 20 are disposed on the display panel 10 horizontally symmetrically and vertically asymmetrically may include a case in which one speaker 21 is disposed in the left surface 10c of the display panel 10, one speaker 22 is disposed in the right surface 10d, and one speaker 23 is disposed in the lower surface 10b as illustrated in FIG. 13A. In this case, because a speaker is not disposed in the upper surface 10a of the display panel 10, the speaker 23 is vertically asymmetrical.

Figure 14A:
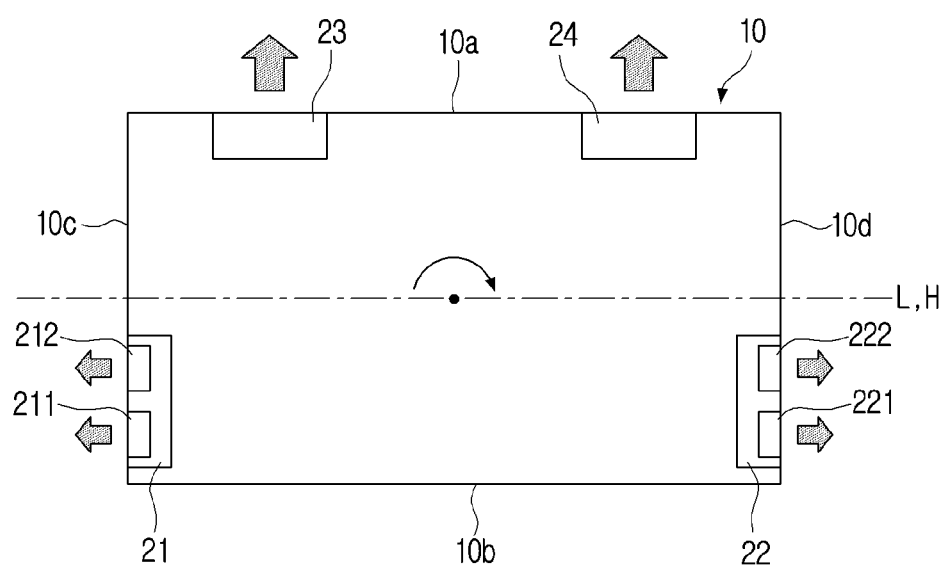
FIG. 14A is a diagram illustrating a state in which a rotatable display apparatus having four speakers is disposed in a horizontal arrangement according to an embodiment.

As another example, the case in which the plurality of speakers 20 are disposed on the display panel 10 horizontally symmetrically and vertically asymmetrically may include a case in which one speaker 21 is disposed in the left surface 10c of the display panel 10, one speaker 22 is disposed in the right surface 10d, and two speakers 23 and 24 are disposed in the upper surface 10a as illustrated in FIG. 14A. In this case, because no speaker is disposed in the lower surface 10b of the display panel 10, the plurality of speakers 23 and 24 are vertically asymmetrical.

The rotating device 30 is disposed at the center of the rear surface 15 of the display panel 10, and may be configured to rotate the display panel 10. The rotating device 30 may be configured to rotate the display panel 10 manually or automatically.

The display panel 10 may be arranged in any one of a horizontal arrangement, a vertical arrangement, and an inclined arrangement by the rotating device 30.

Here, the horizontal arrangement refers to a case in which the display panel 10 is disposed such that the horizontal length L1 of the display panel 10 is longer than the vertical length L2 thereof. In the horizontal arrangement, the display panel 10 is in a horizontal state. In other words, the angle between the longitudinal center line L of the display panel 10 and the horizontal line H is zero (0) degrees.

The vertical arrangement refers to a case in which the display panel 10 is disposed such that the horizontal length L1 of the display panel 10 is shorter than the vertical length L2 thereof. When the display panel 10 disposed in the horizontal arrangement is rotated 90 degrees, the display panel 10 is in the vertical arrangement. In the case of vertical arrangement, the longitudinal center line L of the display panel 10 may form a right angle with respect to the horizontal line H.

The inclined arrangement refers to a case in which the display panel 10 is disposed such that the longitudinal center line L of the display panel 10 is inclined at a certain angle with respect to the horizontal line H, that is, greater than 0 degrees and less than 90 degrees. When the display panel 10 disposed in the horizontal arrangement is rotated at an angle of less than 90 degrees in a clockwise or counter-clockwise direction, the display panel 10 is in the inclined arrangement.

When the rotating device 30 is configured to be manually operated, a user may rotate the display panel 10 at a desired angel while holding the display panel 10 by hand. The rotating device 30 may be configured to rotate the display panel 10 by 90 degrees. In addition, the rotating device 30 may be configured to fix the display panel 10 at an arbitrary angle.

For example, the rotating device 30 may be configured such that when the rotating device 30 is in an operating state, the display panel 10 can be rotated, and when the rotating device 30 is in a fixed state, the display panel 10 is fixed and the display panel 10 cannot be rotated.

The rotating device 30 may be configured to automatically rotate the display panel 10. The rotating device 30 may be configured to rotate the display panel 10 using a motor 31. In other words, the rotating device 30 may be configured to be driven by the motor 31.

When the rotating device 30 is configured to be automatically operated, the display panel 10 may be rotated by operating the rotating device 30 using a remote control of the display apparatus 1. Alternatively, the display panel 10 may be rotated by a certain angle using a rotation button provided on the display apparatus 1.

The rotating device 30 may be supported by a stand 40 as illustrated in FIG. 4. Accordingly, the display panel 10 may be rotated while being supported by the stand 40.

As another example, the rotating device 30 may be supported by a wall-mounted device. In this case, the display panel 10 is disposed as a wall-mounted type, and may be rotated by the rotating device 30.

Referring to FIG. 6, the display apparatus 1 may include a main processor 50, a panel rotation detector 51, and an audio signal processor 60.

The main processor 50 may be configured to control the display panel 10 to output an image.

The main processor 50 may be configured to identify the rotation state of the display panel 10 through the panel rotation detector 51. In other words, the main processor 50 may identify whether the display panel 10 is in the horizontal affangement or in the vertical affangement through the panel rotation detector 51.

In addition, the main processor 50 may identify whether the display panel 10 is in the inclined arrangement through the panel rotation detector 51. In the case of the inclined arrangement, the main processor 50 may identify the angle at which the display panel 10 is inclined with respect to the horizontal line H through the panel rotation detector 51. Here, the inclined arrangement refers to a case in which that the display panel 10 is provided such that the longitudinal center line L of the display panel 10 is inclined at an angle that exceeds 0 degrees and is less than 90 degrees with respect to the horizontal line H, except when the display panel 10 is in a horizontal state or a vertical state.

The panel rotation detector 51 is configured to detect the rotation of the display panel 10, and may be disposed inside the display panel 10. As the panel rotation detector 51, a gyro sensor, a motor rotation detector, or the like may be used.

The panel rotation detector 51 may be configured to output a rotation signal including information on the rotation angle of the display panel 10 to the main processor 50. Accordingly, the main processor 50 may identify the rotation state of the display panel 10 through the rotation signal input from the panel rotation detector 51.

When the rotating device 30 is configured to be driven by the motor 31, the main processor 50 may be configured to control the motor 31 of the rotating device 30 to rotate the display panel 10.

For example, the user may input a rotation angle of the display panel 10 through an input part of the display apparatus 1, and the main processor 50 may control the motor 31 according to the rotation angle input through the input part to rotate the display panel 10.

The main processor 50 may be configured to identify the rotation angle of the display panel 10 rotated by the rotating device 30 through rotation information of the panel rotation detector 51 or the motor 31.

The main processor 50 may be configured to control the audio signal processor 60 to cause the plurality of speakers 20 to emit sound corresponding to an image displayed on the display panel 10.

The main processor 50 may be configured to transmit rotation state information of the display panel 10 to the audio signal processor 60. Then, the audio signal processor 60 may transmit an audio signal to the plurality of speakers 20 to emit a sound coffesponding to the rotation state of the display panel 10. In other words, the audio signal processor 60 may be configured to output audio signals to the plurality of speakers 20 based on the rotation state of the display panel 10 to perform sound image localization.

For example, the audio signal processor 60 may be configured to transmit a left audio signal, a right audio signal, and a mixed audio signal to the plurality of speakers 20 based on the rotation state of the display panel 10.

The left audio signal is an audio signal coffesponding to a left sound, and the right audio signal is an audio signal coffesponding to a right sound. Accordingly, when two speakers 20 receiving the left audio signal and the right audio signal emit a left sound and a right sound, respectively, stereo sound may be realized.

The mixed audio signal refers to an audio signal including a left audio signal and a right audio signal. The speaker 20 receiving the mixed audio signal may emit a left sound and a right sound.

The mixed audio signal may be generated by mixing the left audio signal and the right audio signal at a certain ratio. The mixed audio signal may be generated by a mixing portion, that is, a mixer 61 provided in the audio signal processor 60.

The mixer 61 may be configured to determine a mixing ratio of the left audio signal and the right audio signal according to the rotation angle of the display panel 10, and to mix the left audio signal and the right audio signal according to the mixing ratio to generate a mixed audio signal.

The audio signal processor 60 may be configured to output a mixed audio signal to the speaker 20 when the display panel 10 is in the inclined arrangement. However, when the display panel 10 is in the horizontal arrangement or in the vertical arrangement, the audio signal processor 60 does not output the mixed audio signal to the speaker 20.

The audio signal processor 60 may be configured to identify the positions of the plurality of speakers 20 based on the rotation state information of the display panel 10 received from the main processor 50. In detail, the audio signal processor 60 may be identify a speaker to transmit each of the left audio signal, the right audio signal, and the mixed audio signal among the plurality of speakers 20 based on the rotation state of the display panel 10.

For example, when the display panel 10 is inclined, the audio signal processor 60 may transmit a left audio signal to a speaker positioned at the leftmost side among the plurality of speakers 20, transmit a right audio signal to a speaker positioned at the rightmost side among the plurality of speakers 20, and transmit a mixed audio signal to the remaining speakers among the plurality of speakers 20. Then, the rotatable display apparatus 1 according to an embodiment may implement sound image localization and stereo.

The main processor 50, the audio signal processor 60, and the mixer 61 as described above may be provided on the electronic circuit substrate disposed inside the display panel 10.

Hereinafter, an operation of the rotatable display apparatus 1 according to an embodiment will be described in detail with reference to FIGS. 7A to 7E.

Figure 7A:
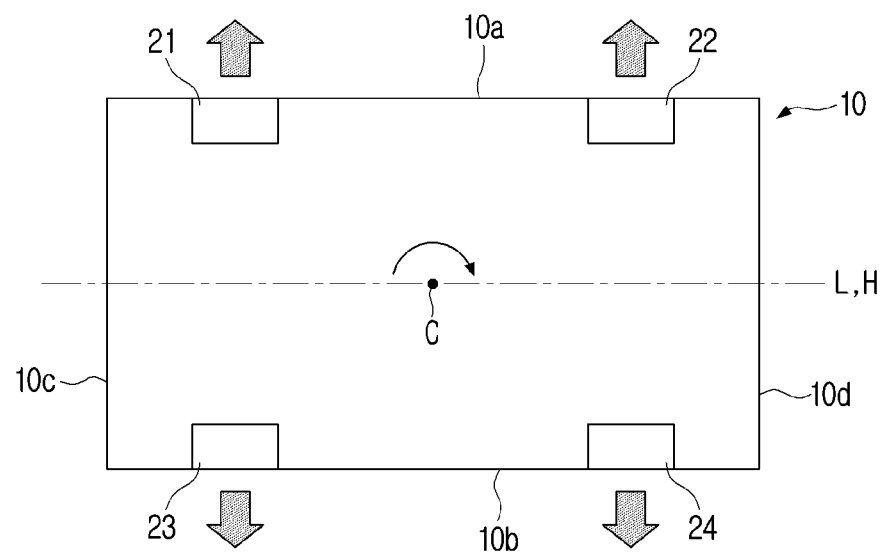
FIG. 7A is a diagram illustrating a state in which a rotatable display apparatus having four speakers is disposed in a horizontal arrangement according to an embodiment.
Figure 7B:
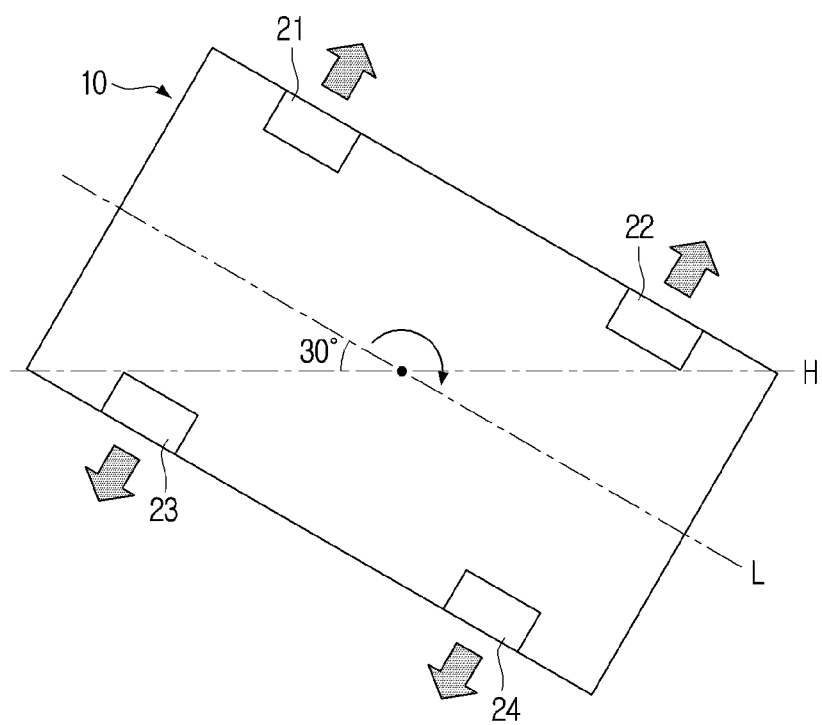
FIG. 7B is a diagram illustrating a state in which the rotatable display apparatus of FIG. 7A is rotated by 30 degrees in a clockwise direction according to an embodiment.
Figure 7C:
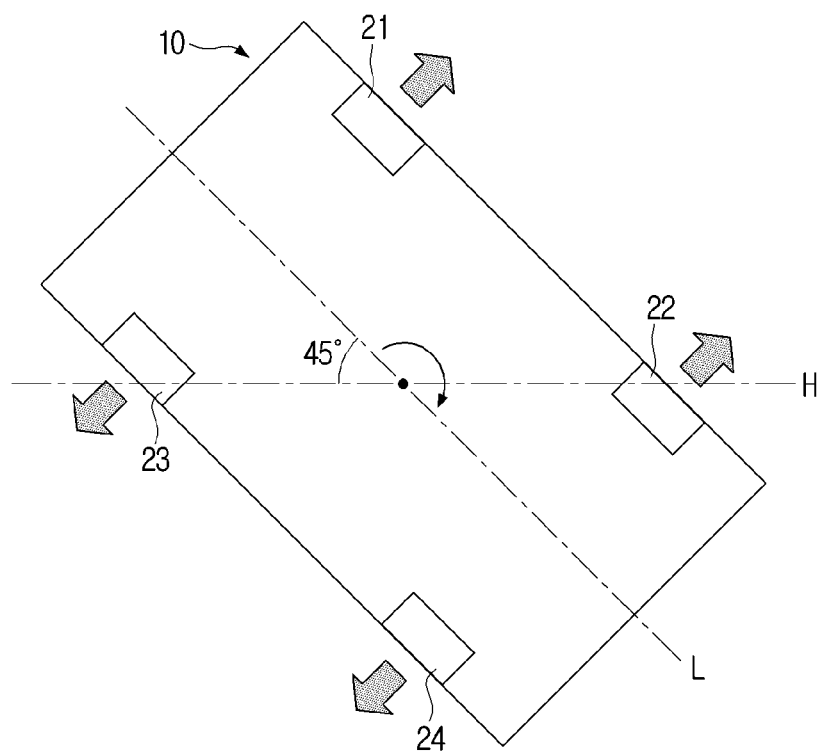
FIG. 7C is a diagram illustrating a state in which the rotatable display apparatus of FIG. 7A is rotated by 45 degrees in a clockwise direction according to an embodiment.
Figure 7D:
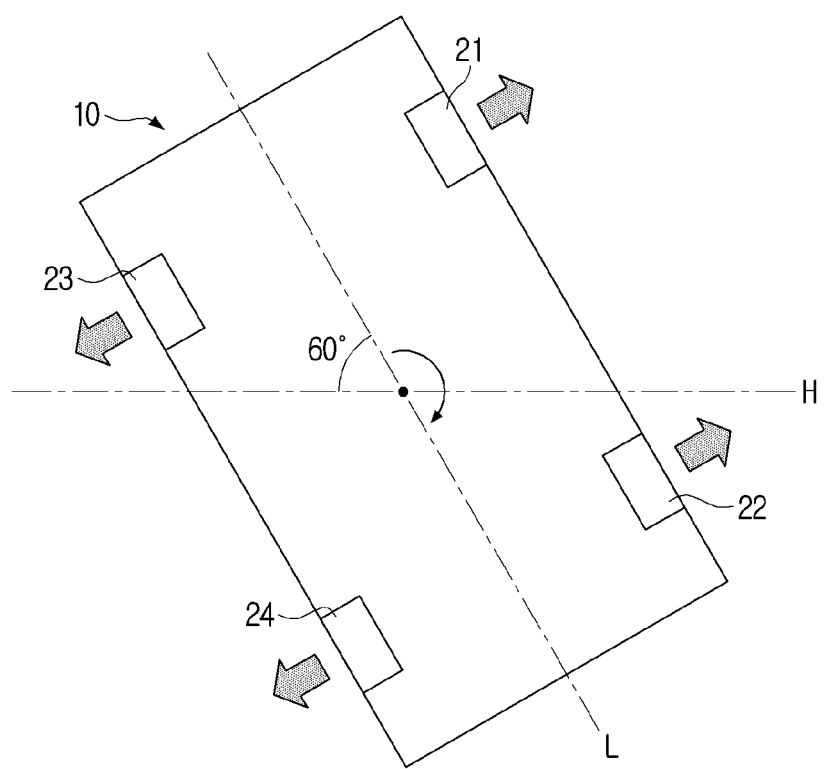
FIG. 7D is a diagram illustrating a state in which the rotatable display apparatus of FIG. 7A is rotated by 60 degrees in a clockwise direction according to an embodiment.
Figure 7E:
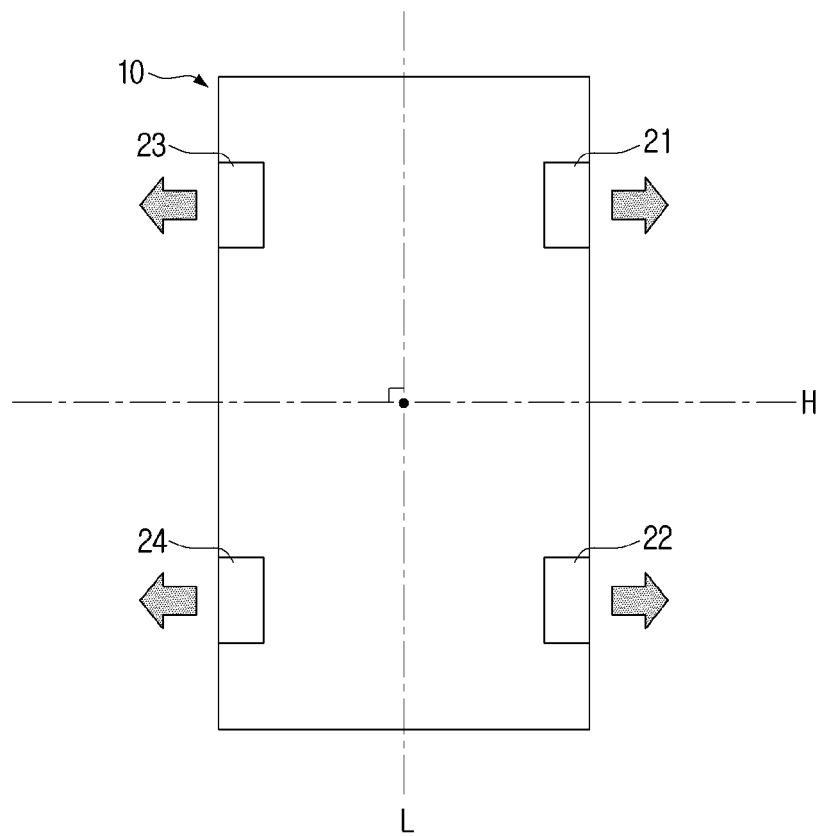
FIG. 7E is a diagram illustrating a state in which the rotatable display apparatus of FIG. 7A is rotated 90 degrees in a clockwise direction to be in a vertical arrangement according to an embodiment.

FIG. 7A is a diagram illustrating a state in which a rotatable display apparatus having four speakers is disposed in a horizontal arrangement according to an embodiment. FIG. 7B is a diagram illustrating a state in which the rotatable display apparatus of FIG. 7A is rotated by 30 degrees in a clockwise direction according to an embodiment. FIG. 7C is a diagram illustrating a state in which the rotatable display apparatus of FIG. 7A is rotated by 45 degrees in a clockwise direction according to an embodiment. FIG. 7D is a diagram illustrating a state in which the rotatable display apparatus of FIG. 7A is rotated by 60 degrees in a clockwise direction according to an embodiment. FIG. 7E is a diagram illustrating a state in which the rotatable display apparatus of FIG. 7A is rotated 90 degrees in a clockwise direction to be in a vertical arrangement according to an embodiment For reference, FIGS. 7A to 7E conceptually illustrate a display panel and a plurality of speakers in order to show an arrangement of the plurality of speakers according to rotation of the display panel.

Referring to FIG. 7A, the rotatable display apparatus 1 according to an embodiment includes four speakers 21, 22, 23, and 24. In detail, the display apparatus 1 includes two speakers provided in the upper surface 10a of the display panel 10, that is, a first speaker 21 and a second speaker 22, and two speakers provided in the lower surface 10b of the display panel 10, that is, a third speaker 23 and a fourth speaker 24.

When the display panel 10 is provided in the horizontal arrangement as illustrated in FIG. 7A, the audio signal processor 60 transmits the left audio signal to the two speakers 21 and 23 positioned on the left side among the four speakers, and transmits the right audio signal to the two speakers 22 and 24 positioned on the right side.

In detail, the audio signal processor 60 transmits the left audio signal to the first speaker 21 and the third speaker 23 positioned in the upper and lower portions of the left side of the display panel 10. The audio signal processor 60 transmits the right audio signal to the second speaker 22 and the fourth speaker 24 positioned in the upper and lower portions of the right side of the display panel 10.

Then, the sound emitted from the display apparatus 1 provided in the horizontal arrangement may implement stereo. In addition, because the first speaker 21 and the second speaker 22 disposed in the upper surface 10a of the display panel 10 and the third speaker 23 and fourth speaker 24 disposed in the lower surface 10b of the display panel 10 emit sound, the sound image is located in the center of the screen 11. Accordingly, the rotatable display apparatus 1 according to an embodiment may implement sound image localization.

When the display panel 10 is inclined by rotating a predetermined angle in the clockwise direction, the audio signal processor 60 outputs a left audio signal to the third speaker 23 positioned at the leftmost side, outputs a right audio signal to the second speaker 22 positioned at the rightmost side, and outputs mixed audio signals to the first speaker 21 and the fourth speaker 24 positioned between the second speaker 22 and the third speaker 23.

1n this case, the mixer 61 of the audio signal processor 60 may determine a mixing ratio of the left audio signal and the right audio signal included in the mixed audio signal based on the rotation angle of the display panel 10. Also, the audio signal processor 60 may be transmit a mixed audio signal having a different mixing ratio according to the position of the speaker. In detail, a mixed audio signal in which the ratio of the left audio signal is greater than the ratio of the right audio signal is transmitted to the speaker close to the left, and a mixed audio signal in which the ratio of the right audio signal is greater than the ratio of the left audio signal is transmitted to the speaker close to the right.

For example, as illustrated in FIG. 7B, when the display panel 10 is inclined by 30 degrees with respect to the horizontal line H, the mixer 61 transmits a first mixed audio signal obtained by mixing the left audio signal by ⅔ and the right audio signal by ⅓ to the first speaker 21 close to the left side, and transmits a second mixed audio signal obtained by mixing the left audio signal by ⅓ and the right audio signal by ⅔ to the fourth speaker 24 close to the right side.

As illustrated in FIG. 7C, when the display panel 10 is inclined by 45 degrees with respect to the horizontal line H, the mixer 61 may transmit a mixed audio signal obtained by mixing the left audio signal by 50% and the right audio signal by 50% to each of the first speaker 21 and the fourth speaker 24.

As illustrated in FIG. 7D, when the display panel 10 is inclined by 60 degrees with respect to the horizontal line H, the mixer 61 transmits a first mixed audio signal obtained by mixing the left audio signal by ⅓ and the right audio signal by ⅔ to the first speaker 21 close to the right side, and transmits a second mixed audio signal obtained by mixing the left audio signal by ⅔ and the right audio signal by ⅓ to the fourth speaker 24 close to the left side.

Accordingly, the sound emitted from the display panel 10 provided in the inclined arrangement as described above may implement stereo. In addition, because the first speaker 21 and the second speaker 22 disposed in the upper surface 10a of the display panel 10 and the third speaker 23 and fourth speaker 24 disposed in the lower surface 10b of the display panel 10 emit sound, the sound image is located in the center of the screen. Accordingly, the rotatable display apparatus 1 according to an embodiment may implement sound image localization when the display apparatus 1 is in the inclined arrangement.

In addition, when the display panel 10 is in the vertical arrangement as illustrated in FIG. 7E, the audio signal processor 60 transmits the left audio signal to the two speakers 23 and 24 positioned on the left side among the four speakers, and transmits the right audio signal to the two speakers 21 and 22 positioned on the right side.

In detail, the audio signal processor 60 transmits the left audio signal to the third speaker 23 and the fourth speaker 24 positioned on the left side of the display panel 10 disposed in the vertical arrangement, and transmits the right audio signal to the first speaker 21 and the second speaker 22 positioned on the right side of the display panel 10. In other words, in the case of vertical arrangement, the right audio signal is transmitted to the first speaker 21 to which the left audio signal was transmitted when the display panel 10 is disposed in the horizontal arrangement, and the left audio signal is transmitted to the fourth speaker 24 to which the right audio signal was transmitted when disposed in the horizontal arrangement.

Then, the sound emitted from the display apparatus 1 provided in the vertical arrangement may implement stereo. In addition, because the third speaker 23 and the fourth speaker 24 vertically arranged on the left side of the display panel 10 and the first speaker 21 and the second speaker 22 vertically arranged on the right side of the display panel 10 emit sound, the sound image is located in the center of the screen. Accordingly, the rotatable display apparatus 1 according to an embodiment may implement sound image localization when the display apparatus 1 is in the vertical arrangement.

Hereinafter, an operation of the rotatable display apparatus 1 according to an embodiment will be described in detail with reference to FIGS. 8A to 8C.

FIG. 8A is a diagram illustrating a state in which a rotatable display apparatus having four speakers is disposed in a horizontal arrangement according to an embodiment. FIG. 8B is a diagram illustrating a state in which the rotatable display apparatus of FIG. 8A is rotated by 60 degrees in a clockwise direction according to an embodiment. FIG. 8C is a diagram illustrating a state in which the rotatable display apparatus of FIG. 8A is rotated 90 degrees in a clockwise direction to be in a vertical arrangement according to an embodiment.

Referring to FIG. 8A, the rotatable display apparatus 1 according to an embodiment includes four speakers 21, 22, 23, and 24. In detail, the display apparatus 1 includes two speakers provided in the left surface 10c of the display panel 10, that is, a first speaker 21 and a second speaker 22, and two speakers provided in the right surface 10d of the display panel 10, that is, a third speaker 23 and a fourth speaker 24.

When the display panel 10 is provided in the horizontal arrangement as illustrated in FIG. 8A, the audio signal processor 60 transmits the left audio signal to the two speakers 21 and 22 positioned on the left side among the four speakers, and transmits the right audio signal to the two speakers 23 and 24 positioned on the right side.

In detail, the audio signal processor 60 transmits the left audio signal to the first speaker 21 and the second speaker 22 positioned in the left surface 10c of the display panel 10. The audio signal processor 60 transmits the right audio signal to the third speaker 23 and the fourth speaker 24 positioned in the right surface 10d of the display panel 10.

Then, the sound emitted from the display apparatus 1 provided in the horizontal arrangement may implement stereo. In addition, because the first speaker 21 and the third speaker 23 disposed in the upper portion of the display panel 10 and the second speaker 22 and the fourth speaker 24 disposed in the lower portion of the display panel 10 emit sound, the sound image is located in the center of the screen. Accordingly, the rotatable display apparatus 1 according to an embodiment may implement sound image localization.

Figure 8B:
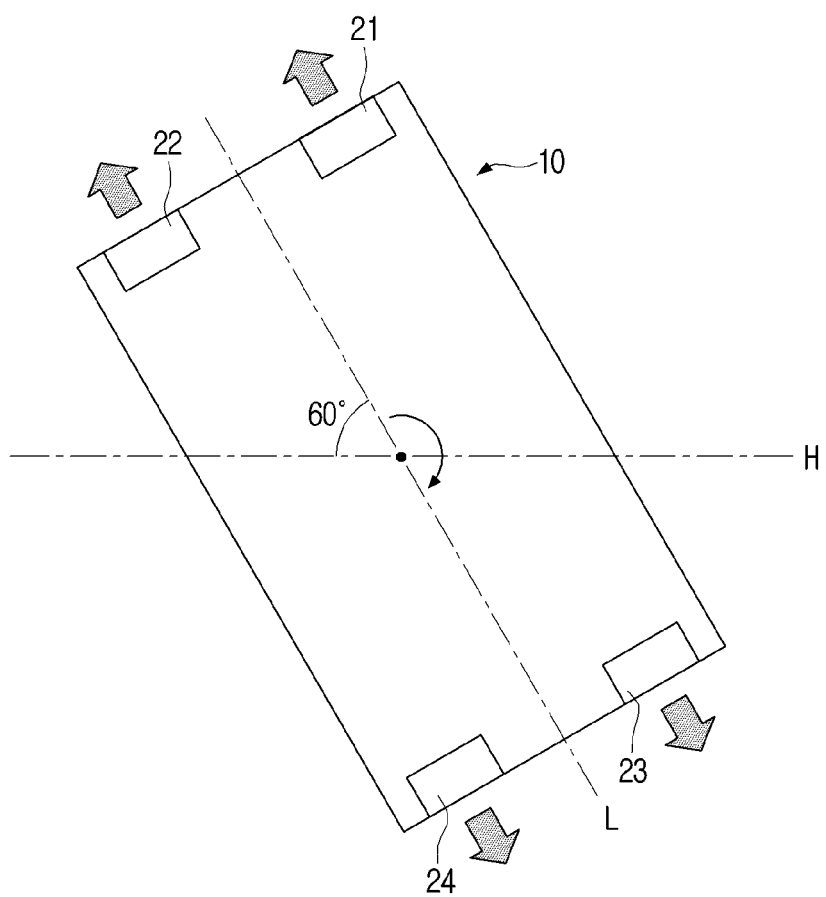
FIG. 8B is a diagram illustrating a state in which the rotatable display apparatus of FIG. 8A is rotated by 60 degrees in a clockwise direction according to an embodiment.

As illustrated in FIG. 8B, when the display panel 10 is inclined by rotating by a predetermined angle in the clockwise direction, the audio signal processor 60 transmits a left audio signal to the second speaker 22 positioned at the leftmost side, transmits a right audio signal to the third speaker 23 positioned at the rightmost side, and transmits mixed audio signals to the first speaker 21 and the fourth speaker 24 positioned between the second speaker 22 and the third speaker 23.

In this case, the mixer 61 of the audio signal processor 60 may determine a mixing ratio of the left audio signal and the right audio signal included in the mixed audio signal based on the rotation angle of the display panel 10. Also, the audio signal processor 60 may transmit a mixed audio signal having a different mixing ratio according to the positions of the speakers 21 and 24.

For example, as illustrated in FIG. 8B, when the display panel 10 is inclined by 60 degrees with respect to the horizontal line H, the mixer 61 transmits a first mixed audio signal obtained by mixing the left audio signal by ⅔ and the right audio signal by ⅓ to the first speaker 21 close to the left side, and transmits a second mixed audio signal obtained by mixing the left audio signal by ⅓ and the right audio signal by ⅔ to the fourth speaker 24 close to the right side.

Accordingly, the sound emitted from the display panel 10 provided in the inclined arrangement as described above may implement stereo. In addition, because the first speaker 21 and the second speaker 22 disposed in the upper portion of the display panel 10 and the third speaker 23 and the fourth speaker 24 disposed in the lower portion of the display panel 10 emit sound, the sound image is located in the center of the screen. Accordingly, the rotatable display apparatus 1 according to an embodiment may implement sound image localization when the display apparatus 1 is in the inclined arrangement.

Figure 8C:
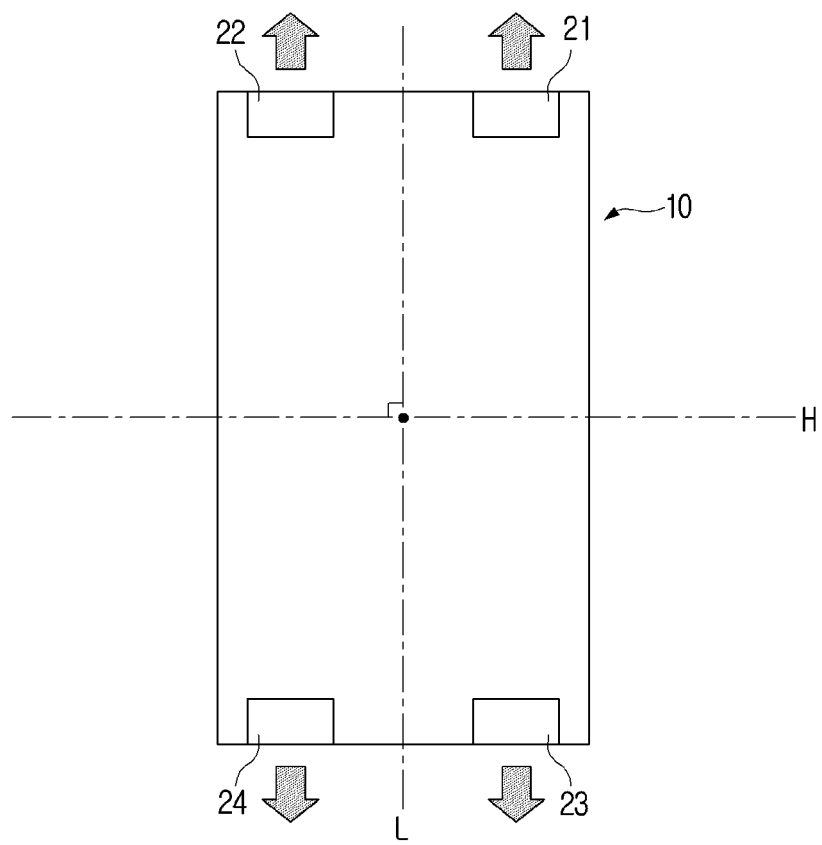
FIG. 8C is a diagram illustrating a state in which the rotatable display apparatus of FIG. 8A is rotated 90 degrees in a clockwise direction to be in a vertical arrangement according to an embodiment.

In addition, when the display panel 10 is provided in the vertical arrangement as illustrated in FIG. 8C, the audio signal processor 60 transmits the left audio signal to the two speakers 22 and 24 positioned on the left side among the four speakers, and transmits the right audio signal to the two speakers 21 and 23 positioned on the right side.

In detail, the audio signal processor 60 transmits the left audio signal to the second speaker 22 and the fourth speaker 24 positioned on the left side of the display panel 10 disposed in the vertical arrangement, and transmits the right audio signal to the first speaker 21 and the third speaker 23 positioned on the right side of the display panel 10. In other words, when the display panel 10 is in the vertical arrangement, the right audio signal is transmitted to the first speaker 21 to which the left audio signal was transmitted when the display panel 10 is disposed in the horizontal arrangement, and the left audio signal is transmitted to the fourth speaker 24 to which the right audio signal was transmitted when the display panel 10 is disposed in the horizontal arrangement.

Then, the sound emitted from the display apparatus 1 provided in the vertical arrangement may implement stereo. In addition, because the second speaker 22 and the fourth speaker 24 vertically arranged on the left side of the display panel 10 provided in the vertical arrangement and the first speaker 21 and the third speaker 23 vertically arranged on the right side of the display panel 10 emit sound, the sound image is located in the center of the screen. Accordingly, the rotatable display apparatus 1 according to an embodiment may implement sound image localization when the display apparatus 1 is in the vertical arrangement.

Hereinafter, an operation of the rotatable display apparatus 1 according to an embodiment will be described in detail with reference to FIGS. 9A to 9C.

FIG. 9A is a diagram illustrating a state in which a rotatable display apparatus having four speakers is disposed in a horizontal arrangement according to an embodiment. FIG. 9B is a diagram illustrating a state in which the rotatable display apparatus of FIG. 9A is rotated by 60 degrees in a clockwise direction according to an embodiment. FIG. 9C is a diagram illustrating a state in which the rotatable display apparatus of FIG. 9A is rotated 90 degrees in a clockwise direction to be in a vertical arrangement according to an embodiment.

Referring to FIG. 9A, the rotatable display apparatus 1 according to an embodiment includes four speakers 21, 22, 23, and 24. In detail, the display apparatus 1 includes a first speaker 21 provided in the left surface 10c of the display panel 10, a second speaker 22 provided in the right surface 10d of the display panel 10 at a position facing the first speaker 21, a third speaker 23 provided in the lower surface 10b of the display panel 10, and a fourth speaker 24 provided in the upper surface 10a of the display panel 10 at a position facing the third speaker 23. In other words, the first speaker 21 and the second speaker 22 are disposed to be left-right (horizontally) symmetric, and the third speaker 23 and the fourth speaker 24 are disposed to be vertically symmetric.

When the display panel 10 is provided in the horizontal arrangement as illustrated in FIG. 9A, the audio signal processor 60 transmits the left audio signal to the first speaker 21 positioned in the left surface 10c of the display panel 10, and transmits the right audio signal to the second speaker 22 positioned in the right surface 10d of the display panel 10. In addition, the audio signal processor 60 transmits audio signals of a low frequency range to the third speaker 23 and fourth speaker 24 positioned in the lower surface 10b and the upper surface 10a of the display panel 10. In this case, an audio signal of a lower frequency range than that of the audio signal transmitted to the third speaker 23 positioned in the lower surface 10b may be transmitted to the fourth speaker 24 positioned in the upper surface 10a of the display panel 10.

Then, the sound emitted from the first speaker 21 and the second speaker 22 disposed on the left side and the right side of the display apparatus 1 provided in the horizontal arrangement may implement stereo. In addition, because the fourth speaker 24 disposed in the upper side of the display panel 10 and the third speaker 23 disposed in the lower side of the display panel 10 emit sound, the sound image is located in the center of the screen. Accordingly, the rotatable display apparatus 1 according to an embodiment may implement sound image localization.

Figure 9B:
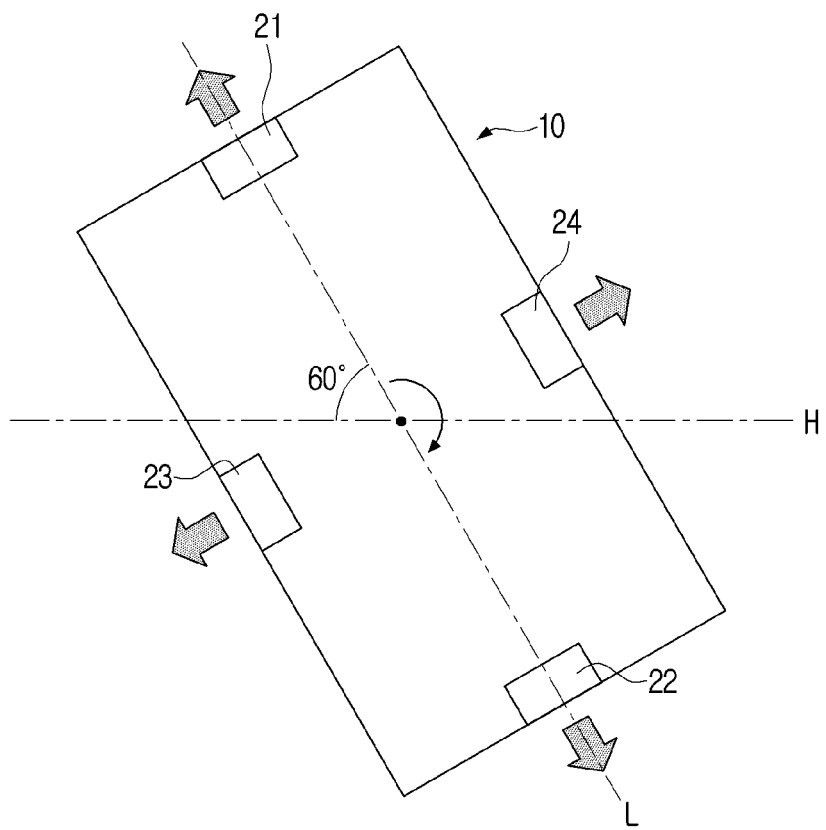
FIG. 9B is a diagram illustrating a state in which the rotatable display apparatus of FIG. 9A is rotated by 60 degrees in a clockwise direction according to an embodiment.

As illustrated in FIG. 9B, when the display panel 10 is inclined by rotating at a predetermined angle in the clockwise direction, the audio signal processor 60 transmits a left audio signal to the first speaker 21 positioned at the leftmost side, transmits a right audio signal to the second speaker 22 positioned at the rightmost side, and transmits mixed audio signals to the third speaker 23 and the fourth speaker 24 positioned between the first speaker 21 and the second speaker 22.

1n this case, the mixer 61 of the audio signal processor 60 may determine a mixing ratio of the left audio signal and the right audio signal included in the mixed audio signal based on the rotation angle of the display panel 10. Also, the audio signal processor 60 may transmit a mixed audio signal having a different mixing ratio according to the positions of the speakers 23 and 24.

For example, as illustrated in FIG. 9B, when the display panel 10 is inclined by 60 degrees with respect to the horizontal line H, the mixer 61 may transmit a first mixed audio signal obtained by mixing the left audio signal by ⅔ and the right audio signal by ⅓ to the third speaker 23 close to the left side, and may transmit a second mixed audio signal obtained by mixing the left audio signal by ⅓ and the right audio signal by ⅔ to the fourth speaker 24 close to the right side.

Accordingly, the sound emitted from the display panel 10 provided in the inclined arrangement as described above may implement stereo. In addition, because the first speaker 21 and the fourth speaker 24 disposed in the upper portion of the display panel 10 and the second speaker 22 and the third speaker 23 disposed in the lower portion of the display panel 10 emit sound, the sound image is located in the center of the screen. Accordingly, the rotatable display apparatus 1 according to an embodiment may implement sound image localization when the display apparatus 1 is in the inclined arrangement.

Figure 9C:
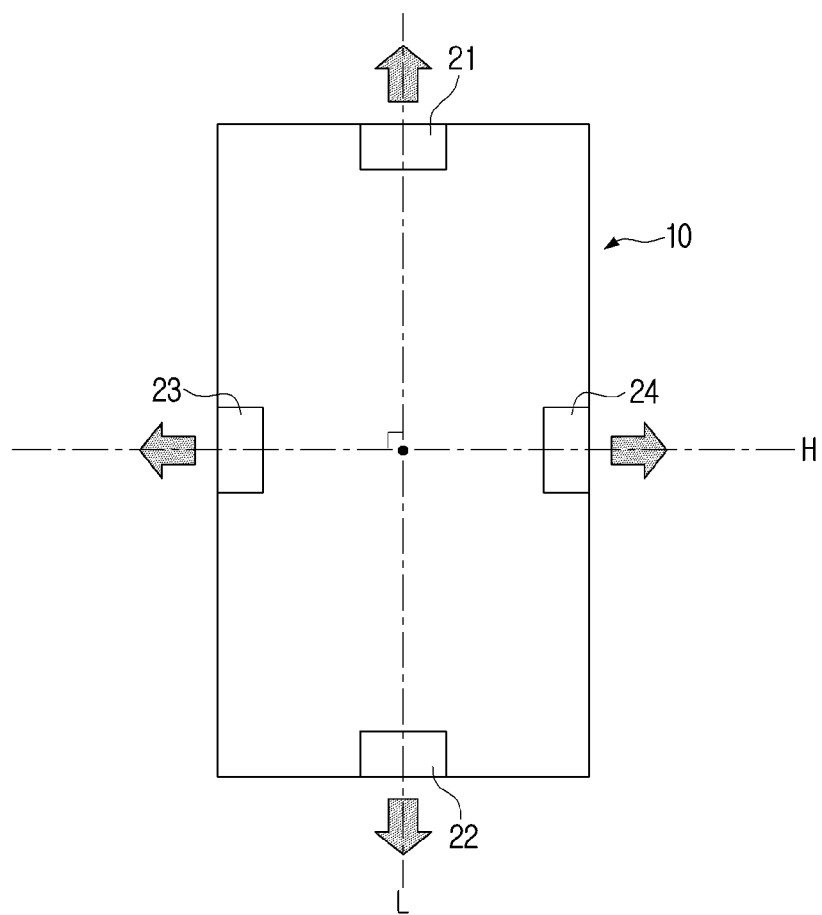
FIG. 9C is a diagram illustrating a state in which the rotatable display apparatus of FIG. 9A is rotated 90 degrees in a clockwise direction to be in a vertical arrangement according to an embodiment.

In addition, when the display panel 10 is provided in the vertical arrangement as illustrated in FIG. 9C, the audio signal processor 60 transmits the left audio signal to the third speaker 23 positioned on the left side among the four speakers, and transmits the right audio signal to the fourth speaker 24 positioned on the right side. In addition, the audio signal processor 60 transmits audio signals of a low frequency range to the first speaker 21 and the second speaker 22 positioned in the upper side and the lower side of the display panel 10. In this case, an audio signal of a lower frequency range than that of the audio signal transmitted to the second speaker 22 positioned in the lower side of the display panel 10 may be transmitted to the first speaker 21 positioned in the upper side.

Then, the sound emitted from the display apparatus 1 provided in the vertical arrangement may implement stereo. In addition, because the first speaker 21 and the second speaker 22 vertically arranged on the display panel 10 provided in the vertical arrangement emit sound, the sound image is located in the center of the screen. Accordingly, the rotatable display apparatus 1 according to an embodiment may implement sound image localization when the display apparatus 1 is in the vertical arrangement.

In the above description, the plurality of speakers 21, 22, 23, and 24 are arranged horizontally symmetrically and vertically symmetrically. However, in the rotatable display apparatus 1 according to an embodiment, the plurality of speakers may be disposed horizontally symmetrically and vertically asymmetrically.

Hereinafter, a rotatable display apparatus 1 in which a plurality of speakers are vertically asymmetrically disposed will be described in detail with reference to FIGS. 10A to 11.

Figure 10B:
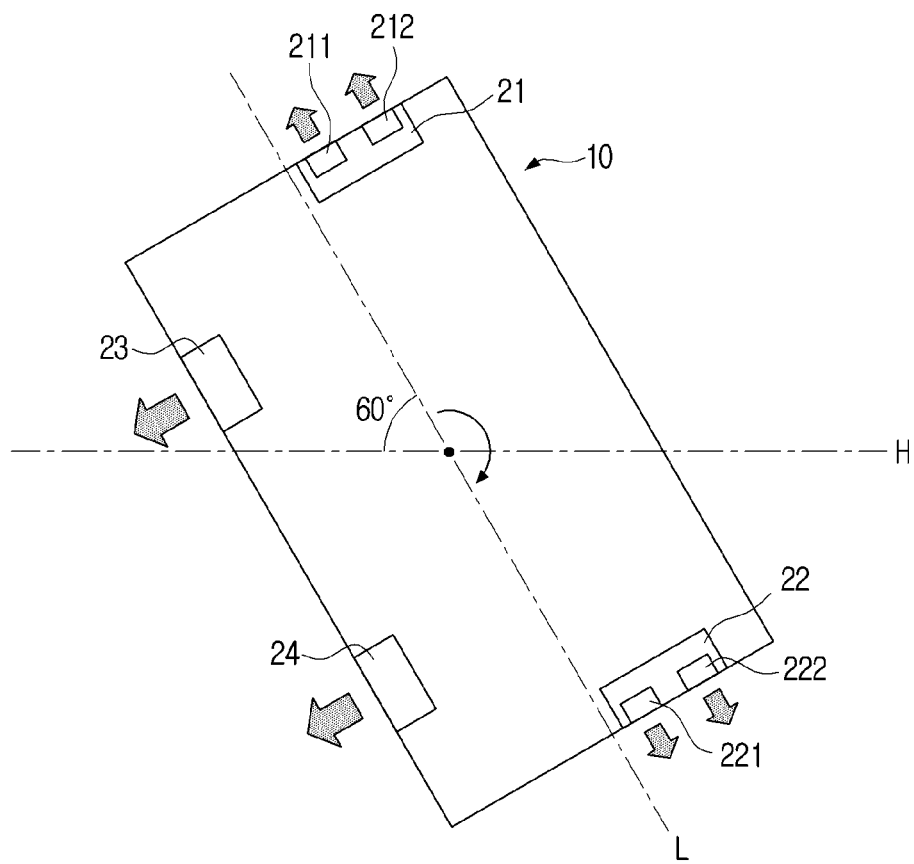
FIG. 10B is a diagram illustrating a state in which the rotatable display apparatus of FIG. 10A is rotated by 60 degrees in a clockwise direction according to an embodiment.
Figure 10C:
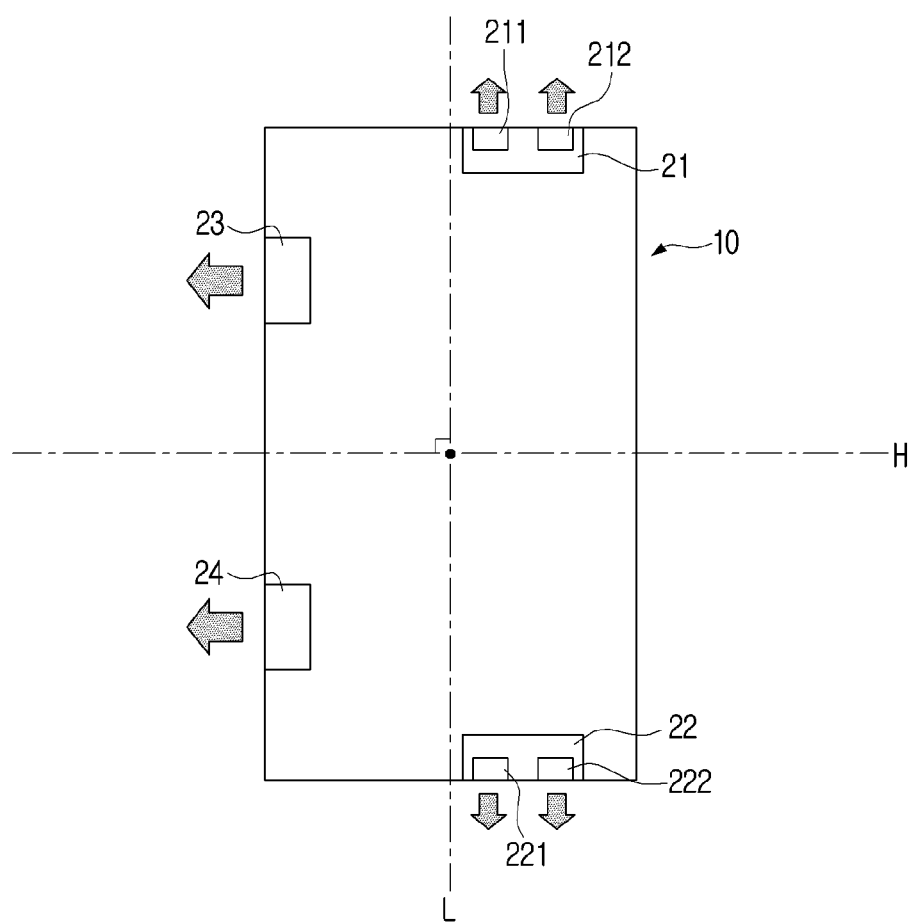
FIG. 10C is a diagram illustrating a state in which the rotatable display apparatus of FIG. 10A is rotated 90 degrees in a clockwise direction to be in a vertical arrangement according to an embodiment.

FIG. 10A is a diagram illustrating a state in which a rotatable display apparatus having four speakers according to an embodiment is disposed in a horizontal arrangement. FIG. 10B is a diagram illustrating a state in which the rotatable display apparatus of FIG. 10A is rotated by 60 degrees in a clockwise direction according to an embodiment. FIG. 10C is a diagram illustrating a state in which the rotatable display apparatus of FIG. 10A is rotated 90 degrees in a clockwise direction to be in a vertical arrangement according to an embodiment.

Referring to FIG. 10A, the rotatable display apparatus 1 according to an embodiment includes four speakers 21, 22, 23, and 24. In detail, the display apparatus 1 includes a first speaker 21 provided in the left surface 10c of the display panel 10, a second speaker 22 provided in the right surface 10d of the display panel 10, and two speakers provided in the lower surface 10b of the display panel 10, that is, a third speaker 23 and a fourth speaker 24.

The first speaker 21 and the second speaker 22 respectively disposed on the left surface 10c and the right surface 10d of the display panel 10 may include two acoustic transducers spaced apart from each other by a predetermined distance.

When the display panel 10 is provided in the horizontal arrangement as illustrated in FIG. 10A, the audio signal processor 60 transmits the left audio signal to the two speakers 21 and 23 positioned on the left side among the fourth speaker, and transmits the right audio signal to the two speakers 22 and 24 positioned on the right side.

In detail, the audio signal processor 60 transmits the left audio signal to the first speaker 21 positioned in the left surface 10c of the display panel 10 and the third speaker 23 positioned on the left side of the lower surface 10b of the display panel 10, and transmits the right audio signal to second speaker 22 positioned in the right surface 10d of the display panel 10 and the fourth speaker 24 positioned on the right side of the lower surface 10b of the display panel 10. In this case, the left audio signal is transmitted to first and second acoustic transducers 211 and 212 of the first speaker 21, and the right audio signal is transmitted to third and fourth acoustic transducers 221 and 222 of the second speaker 22.

Then, the sound emitted from the plurality of speakers 21, 22, 23, and 24 of the display apparatus 1 provided in the horizontal arrangement may implement stereo. In addition, because the first speaker 21 and the second speaker 22 disposed in the upper portion of the display panel 10 and the third speaker 23 and the fourth speaker 24 disposed in the lower portion of the display panel 10 emit sound, the sound image is located in the center of the screen. Accordingly, the rotatable display apparatus 1 according to an embodiment may implement sound image localization.

When the display panel 10 is inclined by rotating a predetermined angle in the clockwise direction, the audio signal processor 60 transmits a left audio signal to the first acoustic transducer 211 of the first speaker 21 positioned at the leftmost side, transmits a right audio signal to the fourth acoustic transducer 222 of the second speaker 22 positioned at the rightmost side, and outputs mixed audio signals to the second acoustic transducer 212 of the first speaker 21 and the third acoustic transducer 221 of the second speaker 22 positioned between the first acoustic transducer 211 of the first speaker 21 and the fourth acoustic transducer 222 of the second speaker 22.

In this case, the mixer 61 of the audio signal processor 60 may determine a mixing ratio of the left audio signal and the right audio signal included in the mixed audio signal based on the rotation angle of the display panel 10. Also, the audio signal processor 60 may transmit a mixed audio signal having a different mixing ratio according to the position of the speaker. In detail, a mixed audio signal in which the ratio of the left audio signal is greater than the ratio of the right audio signal is transmitted to the acoustic transducer of the speaker close to the left side, and a mixed audio signal in which the ratio of the right audio signal is greater than the ratio of the left audio signal is transmitted to the acoustic transducer of the speaker close to the right side.

For example, as illustrated in FIG. 10B, when the display panel 10 is inclined by 60 degrees with respect to the horizontal line H, the mixer 61 may transmit a first mixed audio signal obtained by mixing the left audio signal by ⅔ and the right audio signal by ⅓ to the second acoustic transducer 212 of the first speaker 21 close to the left side, and may transmit a second mixed audio signal obtained by mixing the left audio signal by ⅓ and the right audio signal by ⅔ to the third acoustic transducer 221 of the second speaker 22 close to the right side.

Accordingly, the sound emitted from the display panel 10 provided in the inclined arrangement as described above may implement stereo. In addition, because the first speaker 21 disposed in the upper portion of the display panel 10 and the second speaker 22 disposed in the lower portion of the display panel 10 emit sound, the sound image is located in the center of the screen. Accordingly, the rotatable display apparatus 1 according to an embodiment may implement sound image localization when the display apparatus 1 is in the inclined arrangement.

In addition, when the display panel 10 is provided in the vertical arrangement as illustrated in FIG. 10C, the audio signal processor 60 transmits the left audio signal to the two acoustic transducers 211 and 221 positioned on the left side among the four acoustic transducers of the two speakers 21 and 22, and transmits the right audio signal to the two acoustic transducers 212 and 222 positioned on the right side.

In detail, the audio signal processor 60 transmits the left audio signal to the first acoustic transducer 211 of the first speaker 21 and the third acoustic transducer 221 of the second speaker 22 positioned on the left side of the display panel 10 disposed in the vertical arrangement, and transmits the right audio signal to the second acoustic transducer 212 of the first speaker 21 and the fourth acoustic transducer 222 of the second speaker 22 positioned on the right side of the display panel 10. In other words, when the display panel 10 is disposed in the vertical arrangement, the right audio signal is transmitted to the second acoustic transducer 212 of the first speaker 21 to which the left audio signal was transmitted when the display panel 10 is disposed in the horizontal arrangement, and the left audio signal is transmitted to the third acoustic transducer 221 of the second speaker 22 to which the right audio signal was transmitted when the display panel 10 is disposed in the horizontal arrangement.

Then, the sound emitted from the display apparatus 1 provided in the vertical arrangement may implement stereo. In addition, because the first speaker 21 and the second speaker 22 vertically arranged on the display panel 10 provided in the vertical arrangement emit sound, the sound image is located in the center of the screen. Accordingly, the rotatable display apparatus 1 according to an embodiment may implement sound image localization when the display apparatus 1 is in the vertical arrangement.

In order to solve the sound image bias, the third speaker 23 and the fourth speaker 24 disposed in the lower surface 10b of the display panel 10 may be configured to perform a woofer function. In other words, the audio signal processor 60 may transmit a left audio signal of a low frequency range and a right audio signal of a low frequency range to the third speaker 23 and the fourth speaker 24 disposed in the lower surface 10b of the display panel 10.

In this case, the low frequency range reproduced by the third speaker 23 and the fourth speaker 24 when the display panel 10 is in the horizontal arrangement may be different from the low frequency range reproduced by the third speaker 23 and the fourth speaker 24 when the display panel 10 is in the vertical arrangement.

For example, the low frequency range reproduced by the third speaker 23 and the fourth speaker 24 of the display panel 10 provided in the horizontal arrangement may be higher than the low frequency range reproduced by the third speaker 23 and the fourth speaker 24 of the display panel 10 provided in the vertical arrangement.

Figure 11:
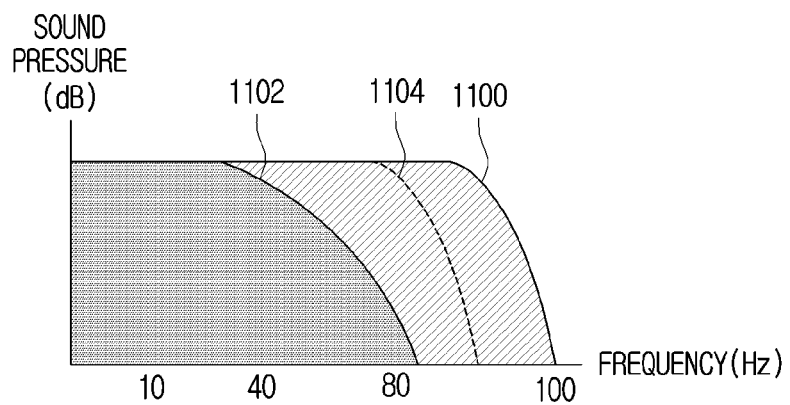
FIG. 11 is a graph illustrating a plurality of parametric equalizers (PEQs) that are used in a rotatable display apparatus according to an embodiment.

FIG. 11 is a graph illustrating a plurality of parametric equalizers (PEQs) that are used in a rotatable display apparatus according to an embodiment.

Referring to FIG. 11, when the display panel 10 is in the horizontal arrangement, a PEQ of each of the third speaker 23 and the fourth speaker 24 may be set such that the third speaker 23 and the fourth speaker 24 reproduce sound of a low frequency range of about 100 Hz or less as in the line 1100.

In addition, when the display panel 10 is in the vertical arrangement, the PEQ of each of the third speaker 23 and the fourth speaker 24 may be set such that the third speaker 23 and the fourth speaker 24 reproduce sound of a low frequency range of about 80 Hz or less as in the line 1102.

When the display panel 10 is in the inclined arrangement, the PEQ of each of the third speaker 23 and the fourth speaker 24 may be set such that the third speaker 23 and the fourth speaker 24 reproduce sound of a low frequency range below an arbitrary value between about 80 Hz and about 100 Hz as in the line 1104.

The PEQs of the third speaker 23 and the fourth speaker 24 may be set by the audio signal processor 60. To this end, the audio signal processor 60 may include a PEQ storage portion 62 in which a plurality of PEQ values are stored.

Figure 12:
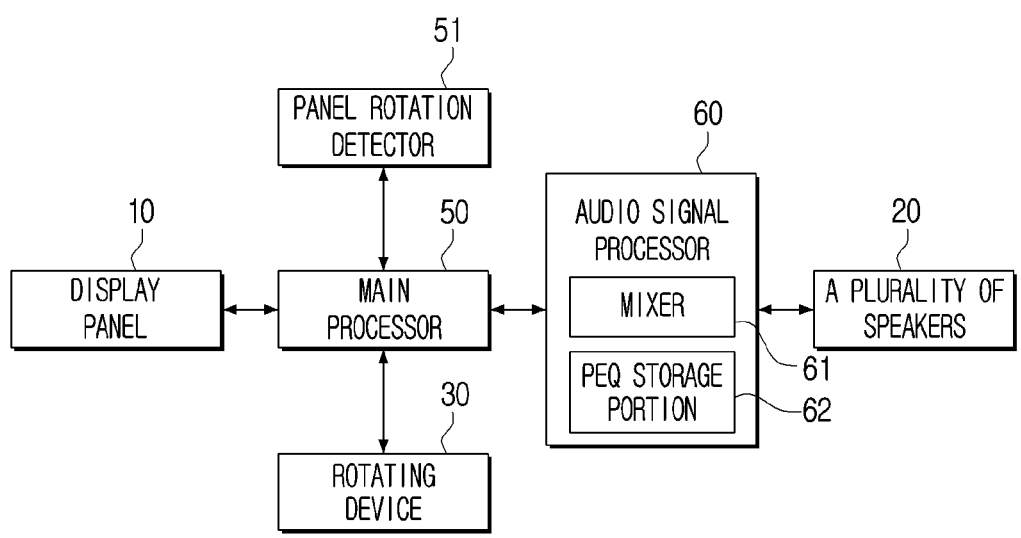
FIG. 12 is a block diagram of a rotatable display apparatus according to an embodiment.

In other words, the rotatable display apparatus 1 according to an embodiment in which the plurality of speakers 20 are vertically asymmetrically disposed may include the PEQ storage portion 62 as illustrated in FIG. 12.

FIG. 12 is a block diagram of a rotatable display apparatus according to an embodiment.

Referring to FIG. 12, the PEQ storage portion 62 is provided in the audio signal processor 60. The PEQ storage portion 62 stores a plurality of PEQ values based on the rotation angle of the display panel 10. For example, the plurality of PEQ values may include a PEQ value when the display panel 10 is in the horizontal arrangement, a PEQ value when the display panel 10 is in the vertical arrangement, and a PEQ value when the display panel 10 is in the inclined arrangement.

The PEQ value in the case of the inclined arrangement may include a plurality of PEQ values having different values according to a predetermined angular interval. For example, the plurality of PEQ values may be set by an interval of 30 degrees and stored in the PEQ storage portion 62.

Accordingly, the audio signal processor 60 may select an appropriate PEQ value from the PEQ storage portion 62 according to the rotation state of the display panel 10, and may use the selected PEQ value to set the PEQ of each of the third speaker 23 and the fourth speaker 24.

Other functions and the mixer 61 of the audio signal processor 60 are the same as or similar to the functions and the mixer 61 of the audio signal processor 60 described with reference to FIG. 6. Therefore, detailed descriptions thereof are omitted.

In addition, the main processor 50 and the panel rotation detector 51 of the display apparatus 1 according to an embodiment are the same as or similar to the main processor 50 and the panel rotation detector 51 described with reference to FIG. 6. Therefore, detailed descriptions thereof are omitted.

Hereinafter, an operation of the rotatable display apparatus 1 according to an embodiment will be described in detail with reference to FIGS. 13A to 13C.

FIG. 13A is a diagram illustrating a state in which a rotatable display apparatus having three speakers is disposed in a horizontal arrangement according to an embodiment. FIG. 13B is a diagram illustrating a state in which the rotatable display apparatus of FIG. 13A is rotated by 60 degrees in a clockwise direction according to an embodiment. FIG. 13C is a diagram illustrating a state in which the rotatable display apparatus of FIG. 13A is rotated 90 degrees in a clockwise direction to be in a vertical arrangement according to an embodiment.

Referring to FIG. 13A, the rotatable display apparatus 1 according to an embodiment includes three speakers 21, 22, and 23. In detail, the display apparatus 1 includes a first speaker 21 provided in the left surface 10c of the display panel 10, a second speaker 22 provided in the right surface 10d of the display panel 10, and a third speaker 23 provided in the lower surface 10b of the display panel 10.

The first speaker 21 and the second speaker 22 respectively disposed on the left surface 10c and the right surface 10d of the display panel 10 may include two acoustic transducers spaced apart from each other by a predetermined distance.

When the display panel 10 is provided in the horizontal arrangement as illustrated in FIG. 13A, the audio signal processor 60 transmits the left audio signal to the first speaker 21 positioned on the left side among the three speakers, and transmits the right audio signal to the second speaker 22 positioned on the right side.

In detail, the audio signal processor 60 transmits the left audio signal to the first acoustic transducer 211 and the second acoustic transducer 212 of the first speaker 21 positioned in the left surface 10c of the display panel 10, and transmits the right audio signal to the third acoustic transducer 221 and the fourth acoustic transducer 222 of the second speaker 22 positioned in the right surface 10d of the display panel 10. Also, the audio signal processor 60 transmits an audio signal of the low frequency range to the third speaker 23 positioned in the lower surface 10b of the display panel 10.

Then, the sound emitted from the display apparatus 1 provided in the horizontal arrangement may implement stereo. In addition, because the first speaker 21 and the second speaker 22 disposed in the upper portion of the display panel 10 and the third speaker 23 disposed in the lower portion of the display panel 10 emit sound, the sound image is located in the center of the screen. Accordingly, the rotatable display apparatus 1 according to an embodiment may implement sound image localization.

When the display panel 10 is inclined by rotating a predetermined angle in the clockwise direction, the audio signal processor 60 transmits a left audio signal to the first acoustic transducer 211 of the first speaker 21 positioned at the leftmost side, transmits a right audio signal to the fourth acoustic transducer 222 of the second speaker 22 positioned at the rightmost side, and transmits mixed audio signals to the second acoustic transducer 212 of the first speaker 21 and the third acoustic transducer 221 of the second speaker 22 positioned between the first acoustic transducer 211 of the first speaker 21 and the fourth acoustic transducer 222 of the second speaker 22.

In this case, the mixer 61 of the audio signal processor 60 may determine a mixing ratio of the left audio signal and the right audio signal included in the mixed audio signal based on the rotation angle of the display panel 10. Also, the audio signal processor 60 may transmit a mixed audio signal having a different mixing ratio according to the position of the speaker. In detail, a mixed audio signal in which the ratio of the left audio signal is greater than the ratio of the right audio signal is transmitted to the acoustic transducer of the speaker close to the left side, and a mixed audio signal in which the ratio of the right audio signal is greater than the ratio of the left audio signal is transmitted to the acoustic transducer of the speaker close to the right side.

Figure 13B:
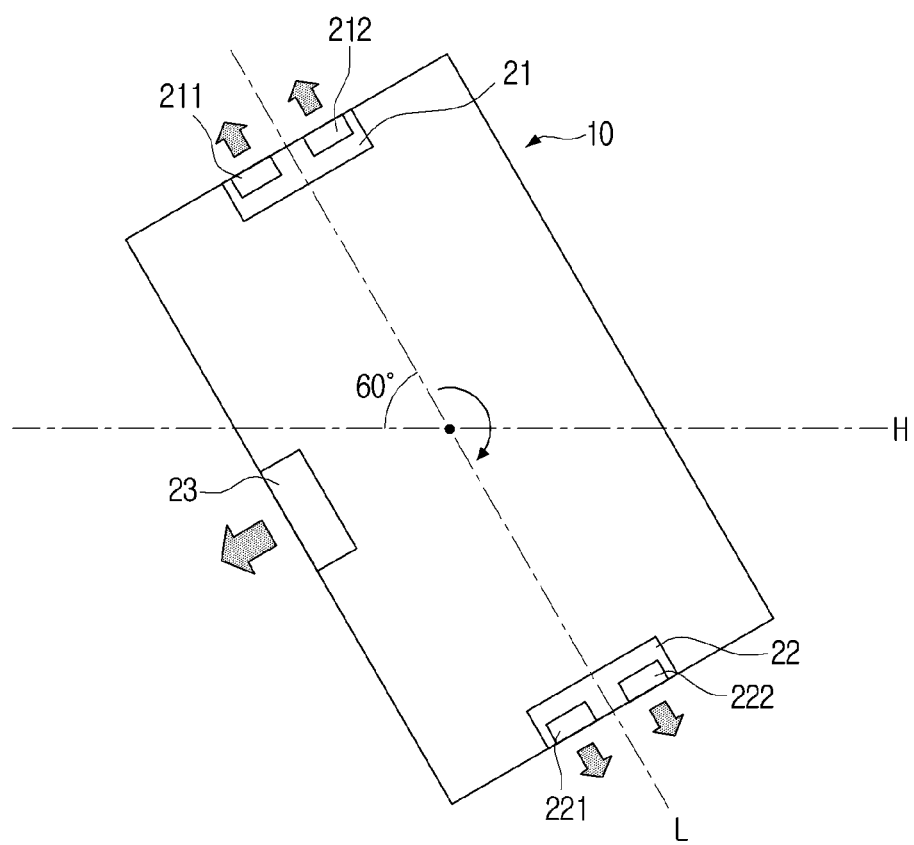
FIG. 13B is a diagram illustrating a state in which the rotatable display apparatus of FIG. 13A is rotated by 60 degrees in a clockwise direction according to an embodiment.

For example, as illustrated in FIG. 13B, when the display panel 10 is inclined by 60 degrees with respect to the horizontal line H, the mixer 61 may transmit a first mixed audio signal obtained by mixing the left audio signal by ⅔ and the right audio signal by ⅓ to the second acoustic transducer 212 of the first speaker 21 close to the left side, and may transmit a second mixed audio signal obtained by mixing the left audio signal by ⅓ and the right audio signal by ⅔ to the third acoustic transducer 221 of the second speaker 22 close to the right side.

Accordingly, the sound emitted from the display panel 10 provided in the inclined arrangement as described above may implement stereo. In addition, because the first speaker 21 disposed in the upper portion of the display panel 10 and the second speaker 22 disposed in the lower portion of the display panel 10 emit sound, the sound image is located in the center of the screen. Accordingly, the rotatable display apparatus 1 according to an embodiment may implement sound image localization when the display apparatus 1 is in the inclined arrangement.

Figure 13C:
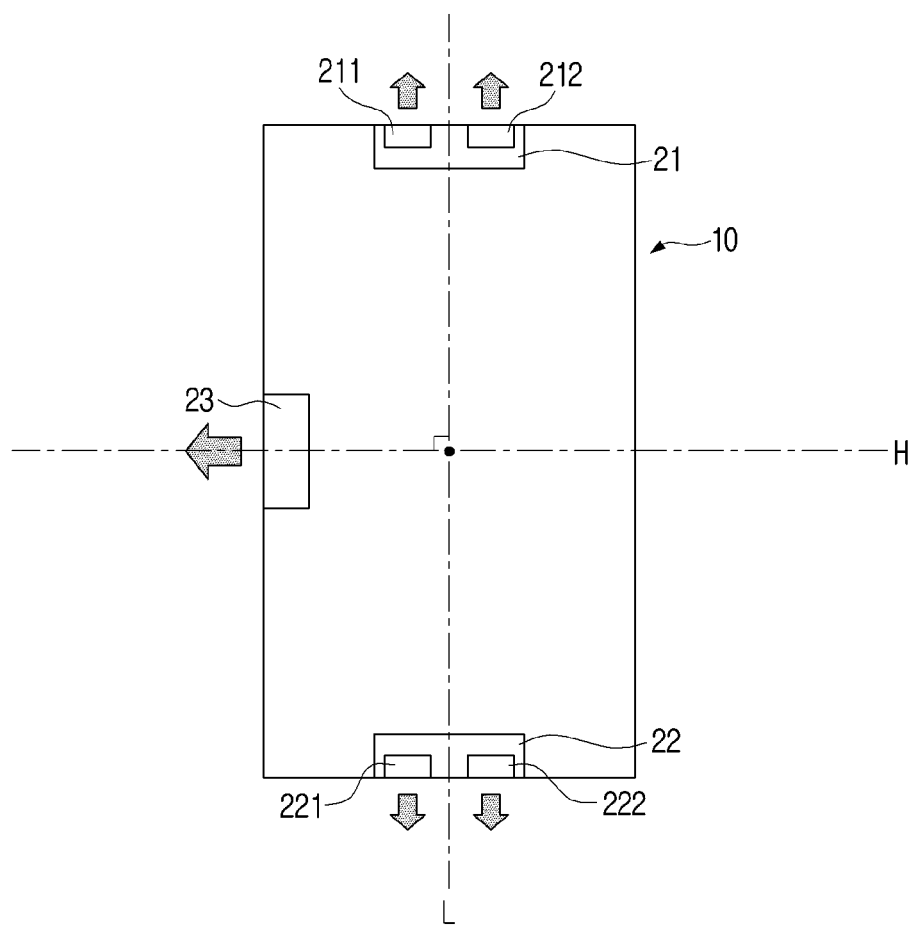
FIG. 13C is a diagram illustrating a state in which the rotatable display apparatus of FIG. 13A is rotated 90 degrees in a clockwise direction to be in a vertical arrangement according to an embodiment.

In addition, when the display panel 10 is in the vertical arrangement as illustrated in FIG. 13C, the audio signal processor 60 transmits the left audio signal to the two acoustic transducers 211 and 221 positioned on the left side among the four acoustic transducers of the two speakers 21 and 22, and transmits the right audio signal to the two acoustic transducers 212 and 222 positioned on the right side.

In detail, the audio signal processor 60 transmits the left audio signal to the first acoustic transducer 211 of the first speaker 21 and the third acoustic transducer 221 of the second speaker 22 positioned on the left side of the display panel 10 disposed in the vertical arrangement, and transmits the right audio signal to the second acoustic transducer 212 of the first speaker 21 and the fourth acoustic transducer 222 of the second speaker 22 positioned on the right side of the display panel 10. In other words, when the display panel 10 is disposed in the vertical arrangement, the right audio signal is transmitted to the second acoustic transducer 212 of the first speaker 21 to which the left audio signal was transmitted when the display panel 10 is disposed in the horizontal arrangement, and the left audio signal is transmitted to the third acoustic transducer 221 of the second speaker 22 to which the right audio signal was transmitted when the display panel 10 is disposed in the horizontal arrangement.

Then, the sound emitted from the display apparatus 1 provided in the vertical arrangement may implement stereo. In addition, because the first speaker 21 and the second speaker 22 vertically arranged on the display panel 10 provided in the vertical arrangement emit sound, the sound image is located in the center of the screen. Accordingly, the rotatable display apparatus 1 according to an embodiment may implement sound image localization when the display apparatus 1 is in the vertical arrangement.

In order to solve the sound image bias, the third speaker 23 disposed in the lower surface 10b of the display panel 10 may be configured to perform a woofer function. In other words, the audio signal processor 60 may transmit a mixed audio signal of the low frequency range in which the left audio signal of the low frequency range and the right audio signal of the low frequency range are mixed with each other to the third speaker 23 disposed in the lower surface 10b of the display panel 10.

In this case, the low frequency range reproduced by the third speaker 23 when the display panel 10 is in the horizontal arrangement may be different from the low frequency range reproduced by the third speaker 23 when the display panel 10 is in the vertical arrangement.

For example, the low frequency range reproduced by the third speaker 23 of the display panel 10 provided in the horizontal arrangement may be higher than the low frequency range reproduced by the third speaker 23 of the display panel 10 provided in the vertical arrangement.

As described in the above embodiment, in order to adjust the low frequency range reproduced by the third speaker 23 according to the rotation of the display panel 10, the audio signal processor 60 may use the plurality of PEQ values stored in the PEQ storage portion 62.

Hereinafter, an operation of the rotatable display apparatus 1 according to an embodiment will be described in detail with reference to FIGS. 14A to 14C.

FIG. 14A is a diagram illustrating a state in which a rotatable display apparatus having four speakers is disposed in a horizontal arrangement according to an embodiment. FIG. 14B is a diagram illustrating a state in which the rotatable display apparatus of FIG. 14A is rotated by 60 degrees in a clockwise direction according to an embodiment. FIG. 14C is a diagram illustrating a state in which the rotatable display apparatus of FIG. 14A is rotated 90 degrees in a clockwise direction to be in a vertical arrangement according to an embodiment.

Referring to FIG. 14A, the rotatable display apparatus 1 according to an embodiment includes four speakers 21, 22, 23, and 24. In detail, the display apparatus 1 includes a first speaker 21 provided in the left surface 10c of the display panel 10, a second speaker 22 provided in the right surface 10d of the display panel 10, and a third speaker 23 and a fourth speaker 24 provided in the upper surface 10a of the display panel 10.

The first speaker 21 and the second speaker 22 respectively disposed on the left surface 10c and the right surface 10d of the display panel 10 may include two acoustic transducers spaced apart from each other by a predetermined distance.

When the display panel 10 is provided in the horizontal arrangement as illustrated in FIG. 14A, the audio signal processor 60 transmits the left audio signal to the two speakers 21 and 23 positioned on the left side among the fourth speaker, and transmits the right audio signal to the two speakers 22 and 24 positioned on the right side.

In detail, the audio signal processor 60 transmits the left audio signal to the first speaker 21 positioned on the lower side of the left surface 10c of the display panel 10 and the third speaker 23 positioned on the left side of the lower surface 10b of the display panel 10, and transmits the right audio signal to the second speaker 22 positioned on the lower side of the right surface 10d of the display panel 10 and the fourth speaker 24 positioned on the right side of the lower surface 10b of the display panel 10. In this case, the left audio signal is transmitted to first and second acoustic transducers 211 and 212 of the first speaker 21, and the right audio signal is transmitted to third and fourth acoustic transducers 221 and 222 of the second speaker 22.

Then, the sound emitted from the display apparatus 1 provided in the horizontal arrangement may implement stereo. In addition, because the first speaker 21 and the second speaker 22 disposed in the lower portion of the display panel 10 and the third speaker 23 and the fourth speaker 24 disposed in the upper portion of the display panel 10 emit sound, the sound image is located in the center of the screen. Accordingly, the rotatable display apparatus 1 according to an embodiment may implement sound image localization.

When the display panel 10 is inclined by rotating a predetermined angle in the clockwise direction, the audio signal processor 60 transmits a left audio signal to the first acoustic transducer 211 of the first speaker 21 positioned at the leftmost side, transmits a right audio signal to the fourth acoustic transducer 222 of the second speaker 22 positioned at the rightmost side, and transmits mixed audio signals to the second acoustic transducer 212 of the first speaker 21 and the third acoustic transducer 221 of the second speaker 22 positioned between the first acoustic transducer 211 of the first speaker 21 and the fourth acoustic transducer 222 of the second speaker 22.

In this case, the mixer 61 of the audio signal processor 60 may determine a mixing ratio of the left audio signal and the right audio signal included in the mixed audio signal based on the rotation angle of the display panel 10. Also, the audio signal processor 60 may transmit a mixed audio signal having a different mixing ratio according to the position of the speaker. In detail, a mixed audio signal in which the ratio of the left audio signal is greater than the ratio of the right audio signal is transmitted to the acoustic transducer of the speaker close to the leftside, and a mixed audio signal in which the ratio of the right audio signal is greater than the ratio of the left audio signal is transmitted to the acoustic transducer of the speaker close to the right side.

Figure 14B:
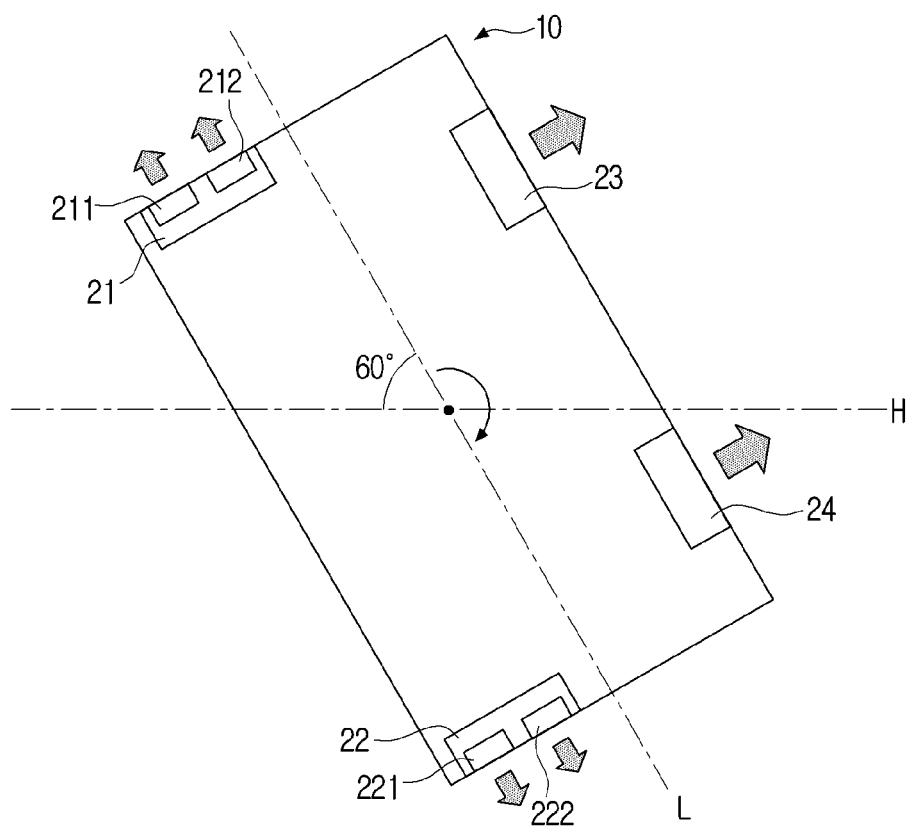
FIG. 14B is a diagram illustrating a state in which the rotatable display apparatus of FIG. 14A is rotated by 60 degrees in a clockwise direction according to an embodiment.

For example, as illustrated in FIG. 14B, when the display panel 10 is inclined by 60 degrees with respect to the horizontal line H, the mixer 61 may transmit a first mixed audio signal obtained by mixing the left audio signal by ⅔ and the right audio signal by ⅓ to the second acoustic transducer 212 of the first speaker 21 close to the left side, and may transmit a second mixed audio signal obtained by mixing the left audio signal by ⅓ and the right audio signal by ⅔ to the third acoustic transducer 221 of the second speaker 22 close to the right side.

Accordingly, the sound emitted from the display panel 10 provided in the inclined arrangement as described above may implement stereo. In addition, because the first speaker 21 disposed in the upper portion of the display panel 10 and the second speaker 22 disposed in the lower portion of the display panel 10 emit sound, the sound image is located in the center of the screen. Accordingly, the rotatable display apparatus 1 according to an embodiment may implement sound image localization when the display apparatus 1 is in the inclined arrangement.

Figure 14C:
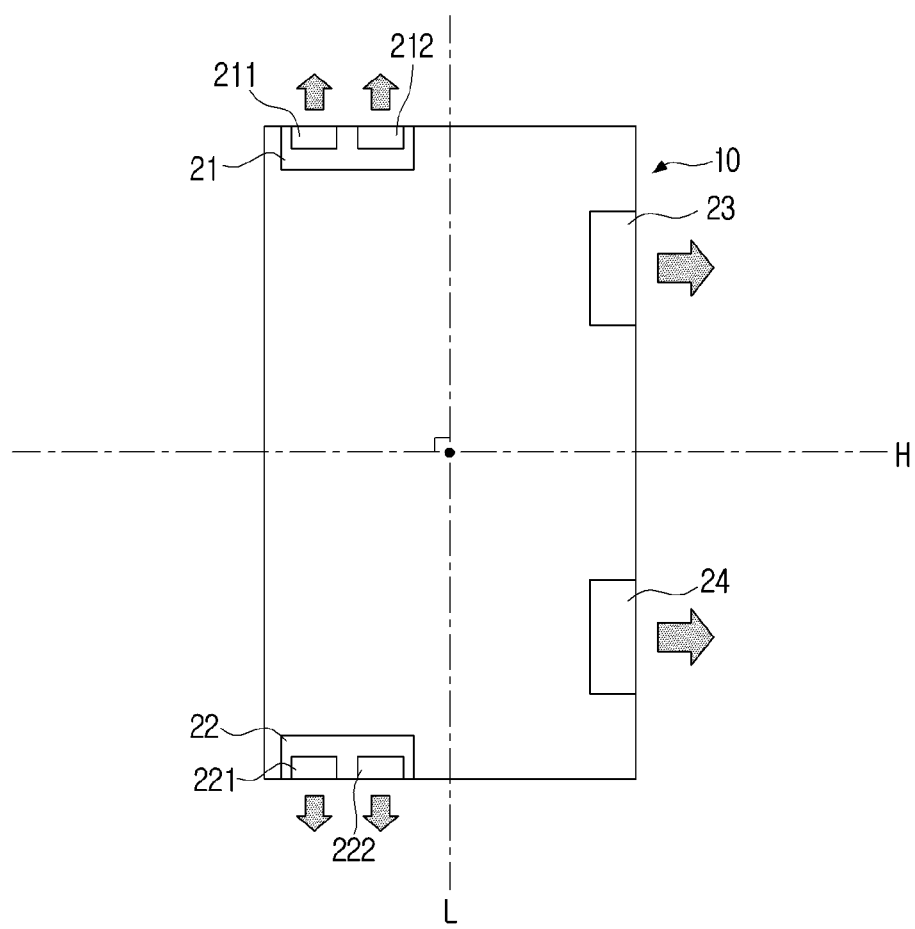
FIG. 14C is a diagram illustrating a state in which the rotatable display apparatus of FIG. 14A is rotated 90 degrees in a clockwise direction to be in a vertical arrangement according to an embodiment.

In addition, when the display panel 10 is provided in the vertical arrangement as illustrated in FIG. 14C, the audio signal processor 60 transmits the left audio signal to the two acoustic transducers 211 and 221 positioned on the left side among the four acoustic transducers of the two speakers 21 and 22, and transmits the right audio signal to the two acoustic transducers 212 and 222 positioned on the right side.

In detail, the audio signal processor 60 transmits the left audio signal to the first acoustic transducer 211 of the first speaker 21 and the third acoustic transducer 221 of the second speaker 22 positioned on the left side of the display panel 10 disposed in the vertical arrangement, and transmits the right audio signal to the second acoustic transducer 212 of the first speaker 21 and the fourth acoustic transducer 222 of the second speaker 22 positioned on the right side of the display panel 10. In other words, when the display panel 10 is disposed in the vertical arrangement, the right audio signal is transmitted to the second acoustic transducer 212 of the first speaker 21 to which the left audio signal was transmitted when the display panel 10 is disposed in the horizontal arrangement, and the left audio signal is transmitted to the third acoustic transducer 221 of the second speaker 22 to which the right audio signal was transmitted when the display panel 10 is disposed in the horizontal arrangement.

Then, the sound emitted from the display apparatus 1 provided in the vertical arrangement may implement stereo. In addition, because the first speaker 21 and the second speaker 22 vertically arranged on the display panel 10 provided in the vertical arrangement emit sound, the sound image is located in the center of the screen. Accordingly, the rotatable display apparatus 1 according to an embodiment may implement sound image localization when the display apparatus 1 is in the vertical arrangement.

In order to solve the sound image bias, the third speaker 23 and the fourth speaker 24 disposed in the upper surface 10a of the display panel 10 may be configured to perform a woofer function. In other words, the audio signal processor 60 may transmit a left audio signal of a low frequency range and a right audio signal of a low frequency range to the third speaker 23 and the fourth speaker 24 disposed in the upper surface 10a of the display panel 10.

In this case, the low frequency range reproduced by the third speaker 23 and the fourth speaker 24 when the display panel 10 is in the horizontal arrangement may be different from the low frequency range reproduced by the third speaker 23 and the fourth speaker 24 when the display panel 10 is in the vertical arrangement.

For example, the low frequency range reproduced by the third speaker 23 and the fourth speaker 24 of the display panel 10 provided in the horizontal arrangement may be higher than the low frequency range reproduced by the third speaker 23 and the fourth speaker 24 of the display panel 10 provided in the vertical arrangement.

As described in the above embodiment, in order to adjust the low frequency range reproduced by the third speaker 23 and the fourth speaker 24 according to the rotation of the display panel 10, the audio signal processor 60 may use the plurality of PEQ values stored in the PEQ storage portion 62.

In the rotatable display apparatus 1 according to an embodiment, characteristics of a speaker positioned on an upper portion of the display panel 10 may be set differently from characteristics of a speaker positioned on a lower portion of the display panel 10.

Hereinafter, a rotatable display apparatus 1 according to an embodiment will be described with reference to FIGS. 15 to 18B.

Figure 15:
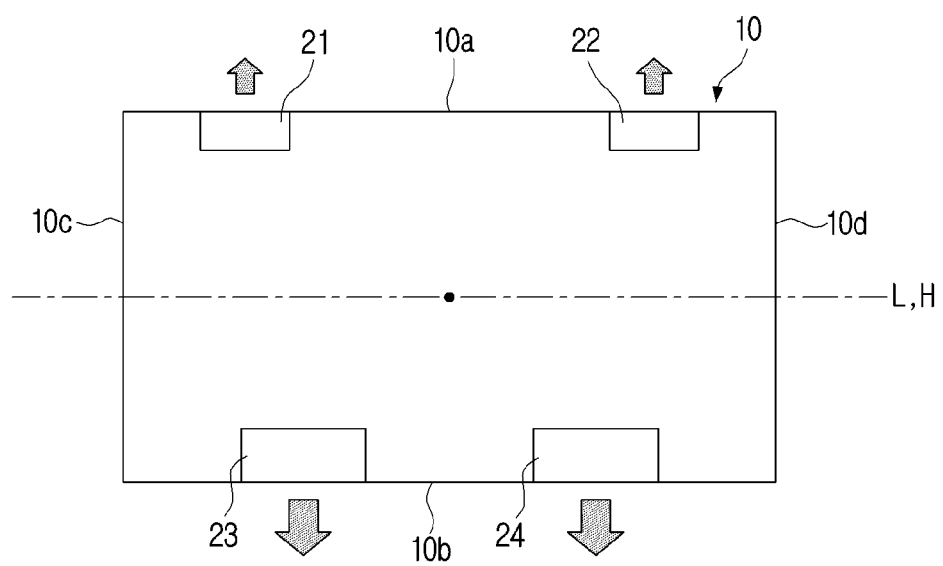
FIG. 15 is a diagram illustrating a state in which a rotatable display apparatus having four speakers is disposed in a horizontal arrangement.
Figure 16A:
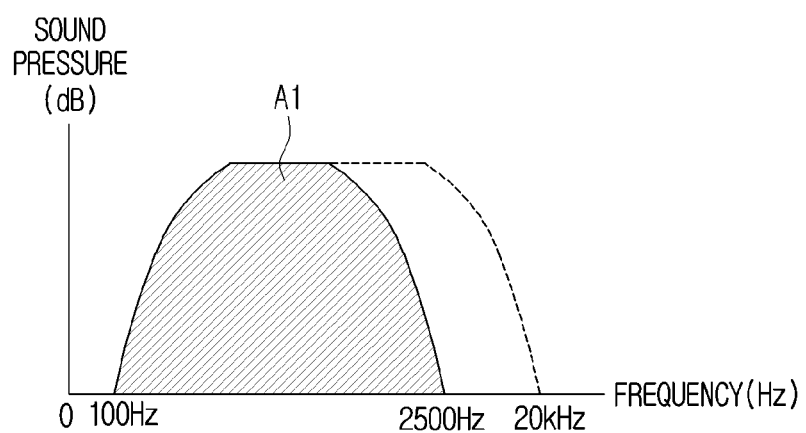
FIG. 16A is a graph illustrating acoustic characteristics of an upper speaker of the rotatable display apparatus of FIG. 15 according to an embodiment.
Figure 16B:
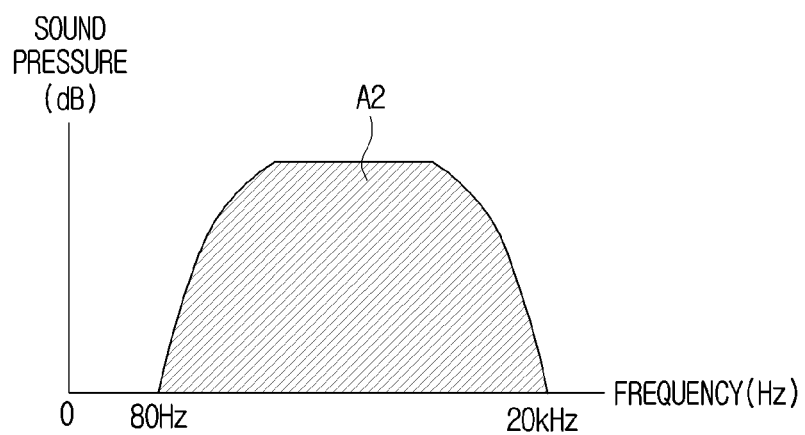
FIG. 16B is a graph illustrating acoustic characteristics of a lower speaker of the rotatable display apparatus of FIG. 15 according to an embodiment.

FIG. 15 is a diagram illustrating a state in which a rotatable display apparatus having four speakers is disposed in a horizontal arrangement. FIG. 16A is a graph illustrating acoustic characteristics of an upper speaker of the rotatable display apparatus of FIG. 15 according to an embodiment. FIG. 16B is a graph illustrating acoustic characteristics of a lower speaker of the rotatable display apparatus of FIG. 15 according to an embodiment. For reference, in FIGS. 16A and 16B, the horizontal axis represents frequency, and the vertical axis represents sound pressure.

Referring to FIG. 15, the rotatable display apparatus 1 according to an embodiment may include four speakers 21, 22, 23, and 24. In detail, the display apparatus 1 includes a first speaker 21 and a second speaker 22 provided in the upper surface 10a of the display panel 10, and a third speaker 23 and a fourth speaker 24 provided in the lower surface 10b of the display panel 10.

When the display panel 10 is provided in the horizontal arrangement as illustrated in FIG. 15, the audio signal processor 60 transmits the left audio signal to the two speakers 21 and 23 positioned on the left side among the four speakers, and transmits the right audio signal to the two speakers 22 and 24 positioned on the right side.

In detail, the audio signal processor 60 transmits the left audio signal to the first speaker 21 and the third speaker 23 positioned in the upper and lower portions of the left side of the display panel 10. The audio signal processor 60 transmits the right audio signal to the second speaker 22 and the fourth speaker 24 positioned in the upper and lower portions of the right side of the display panel 10.

Then, the sound emitted from the display apparatus 1 provided in the horizontal arrangement may implement stereo. In addition, because the first speaker 21 and the second speaker 22 disposed in the upper surface 10a of the display panel 10 and the third speaker 23 and fourth speaker 24 disposed in the lower surface 10b of the display panel 10 emit sound, the sound image is located in the center of the screen. Accordingly, the rotatable display apparatus 1 according to an embodiment may implement sound image localization.

However, when the first speaker 21 and the second speaker 22 provided on the upper portion of the display panel 10 emit sound up to the high frequency reproduction limit that can be reproduced by the first speaker 21 and the second speaker 22, the high frequency component of the sound emitted from the third speaker 23 and the fourth speaker 24 disposed on the lower portion and the high frequency component of the sound emitted from the first speaker 21 and the second speaker 22 disposed on the upper portion are reinforced such that the high frequency sound becomes too strong. Then, the screen and the sound image may not match.

To solve this problem, the upper speaker, that is, the first speaker 21 and the second speaker 22 may be configured to reproduce only the sound of a predetermined frequency or less, that is, only the mid-frequency range sound and the low-frequency range sound. For example, as illustrated in FIG. 16A, the upper speakers 21 and 22 may be configured to reproduce a sound having a frequency in the range A1 of about 100 Hz to about 2500 Hz.

In this case, the lower speaker, that is, the third speaker 23 and the fourth speaker 24 may be configured to emit sound up to the high frequency reproduction limit that can be reproduced by the third speaker 23 and the fourth speaker 24. For example, as illustrated in FIG. 16B, the lower speakers 23 and 24 may be configured to reproduce a sound having a frequency in the range A2 of about 80 Hz to about 20 kHz. Accordingly, the lower speakers 23 and 24 may reproduce a sound of a low frequency range lower than that of the upper speakers 21 and 22 and a sound of a high frequency range higher than that of the upper speakers 21 and 22.

When the upper speakers 21 and 22 are configured to reproduce only the mid-low frequency range sound in this way, the screen and the sound image may be matched.

Figure 17:
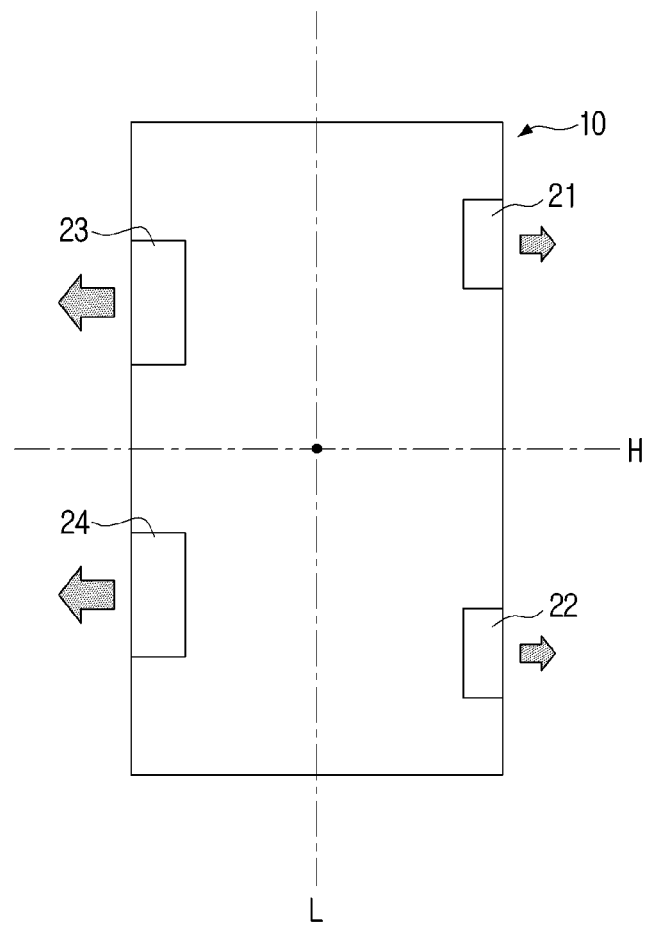
FIG. 17 is a diagram illustrating a state in which the rotatable display apparatus of FIG. 15 is rotated 90 degrees in a clockwise direction to be in a vertical arrangement according to an embodiment.

This may be equally applied when the display panel 10 is disposed in the vertical arrangement as illustrated in FIG. 17.

Figure 18A:
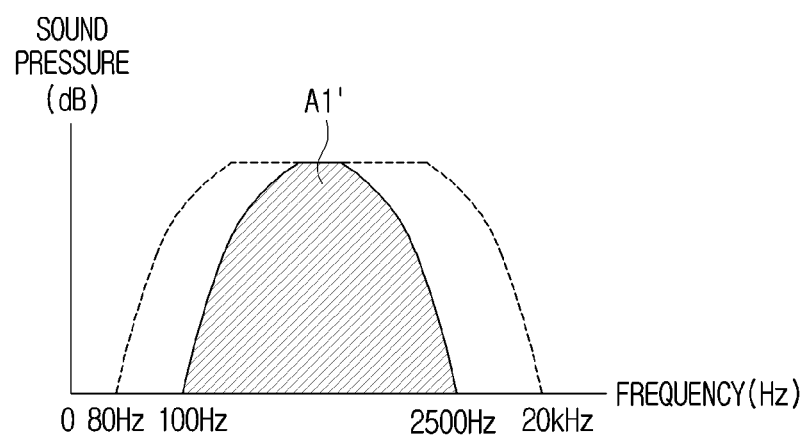
FIG. 18A is a graph illustrating acoustic characteristics of an upper speaker of the rotatable display apparatus of FIG. 17 according to an embodiment.
Figure 18B:
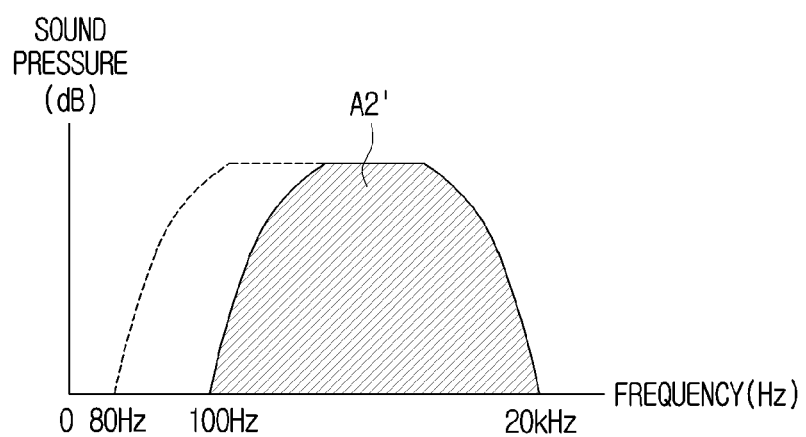
FIG. 18B is a graph illustrating acoustic characteristics of a lower speaker of the rotatable display apparatus of FIG. 17 according to an embodiment.

FIG. 17 is a diagram illustrating a state in which the rotatable display apparatus of FIG. 15 is rotated 90 degrees in a clockwise direction to be in a vertical arrangement according to an embodiment. FIG. 18A is a graph illustrating acoustic characteristics of an upper speaker of the rotatable display apparatus of FIG. 17 according to an embodiment. FIG. 18B is a graph illustrating acoustic characteristics of a lower speaker of the rotatable display apparatus of FIG. 17 according to an embodiment. For reference, in FIGS. 18A and 18B, the horizontal axis represents frequency, and the vertical axis represents sound pressure.

Referring to FIG. 17, when the display panel 10 is disposed in the vertical arrangement, the upper speaker, that is, the first speaker 21 and the second speaker 22 are positioned on the right side of the display panel 10, and the lower speaker, that is, the third speaker 23 and the fourth speaker 24 are positioned on the left side of the display panel 10.

Accordingly, the audio signal processor 60 transmits the left audio signal to the third speaker 23 and the fourth speaker 24 positioned on the left side, and transmits the right audio signal to the first speaker 21 and the second speaker 22 positioned on the right side.

In this case, because the first speaker 21 and the second speaker 22, which are the upper speakers, may not reproduce the sound of the high frequency range and may reproduce the sound of the low frequency range higher than that of the lower speakers 23 and 24, the audio signal processor 60 transmits an audio signal corresponding to the sound of the frequency range reproducible by the first speaker 21 and the second speaker 22 to the third speaker 23 and the fourth speaker 24.

For example, when the audio signal processor 60 transmits the left audio signal to the third speaker 23 positioned on the upper portion of the display panel 10, the third speaker 23 may emit a sound in the range A1' of about 100 Hz to about 2500 Hz as illustrated in FIG. 18A. Also, when the audio signal processor 60 transmits the right audio signal to the first speaker 21, the first speaker 21 emits a sound in the range A1' of about 100 Hz to about 2500 Hz.

When the display panel 10 is disposed in the vertical arrangement as described above, the third speaker 23 positioned on the upper portion of the display panel 10 emits the sound of the same frequency range as that of the first speaker 21. In other words, the first speaker 21 and the third speaker 23 positioned on the upper portion of the display panel 10 emit the sound in the range of about 100 Hz to about 2500 Hz.

In addition, when the audio signal processor 60 transmits the left audio signal to the fourth speaker 24 positioned on the lower portion of the display panel 10, the fourth speaker 24 may emit a sound in the range A2' of about 100 Hz to about 20 kHz as illustrated in FIG. 18B. Also, when the audio signal processor 60 transmits the right audio signal to the second speaker 22 positioned on the lower right portion of the display panel 10, the second speaker 22 emits a sound in the range of about 100 Hz to about 2500 Hz.

As described above, the fourth speaker 24 positioned on the lower portion of the display panel 10 emits the same low frequency sound as the second speaker 22. In other words, the second speaker 22 and the fourth speaker 24 positioned on the lower portion of the display panel 10 emit the sound of about 100 Hz or higher.

When the display panel 10 is disposed in the vertical arrangement as described above, left and right balance may be achieved by matching the low frequency range of the sound emitted by the plurality of speakers to the speaker having the highest low frequency range limit among the plurality of speakers. In addition, when the first speaker 21 and the third speaker 23 positioned on the upper portion are configured to reproduce only the sound of the mid-low frequency range having the lower frequency range than the frequency range reproduced by the second speaker 22 and the fourth speaker 24 positioned on the lower portion, the screen and the sound image may be matched.

The above-described rotatable display apparatus according to an embodiment may be applied to a display apparatus according to the prior art.

Figure 19:
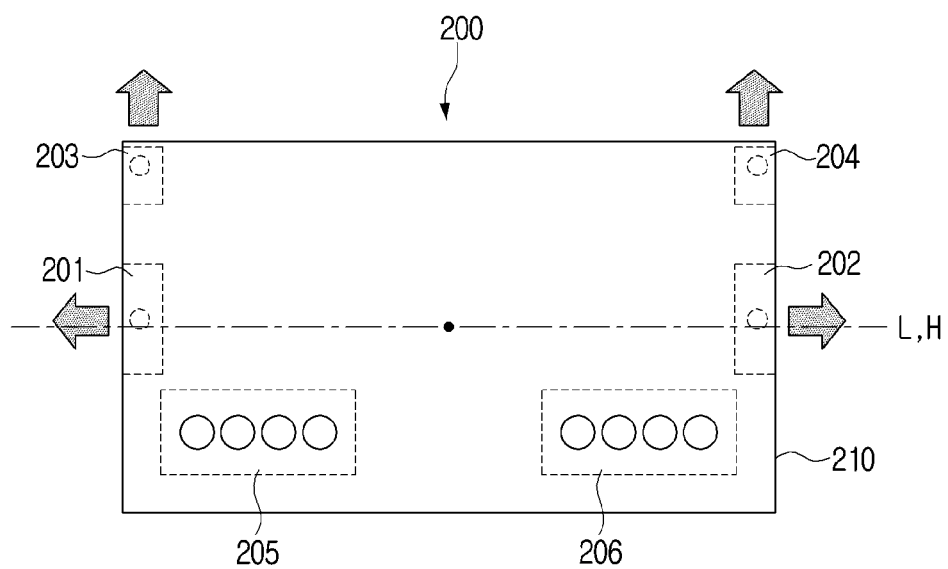
FIG. 19 is a diagram illustrating a display apparatus.

FIG. 19 is a diagram illustrating a display apparatus.

Referring to FIG. 19, a display apparatus 200 has a structure that cannot be rotated. In other words, the display apparatus 200 according to the prior art does not include a rotating device. Accordingly, the display apparatus 200 according to the prior art is used in the horizontal arrangement and may not be used in the vertical arrangement.

In addition, the display apparatus 200 according to the prior art may include six speakers. For example, the display apparatus 200 may include a left speaker 201, a right speaker 202, two upper speakers 203 and 204, and two rear speakers 205 and 206 disposed on the rear surface.

Stereo sound may be implemented through the left speaker 201 and the right speaker 202. In addition, the two upper speakers 203 and 204 may reproduce only the sound of the low and mid frequency range lower than the frequency range of the left speaker 201 and the right speaker 202 such that the screen and the sound image may be matched. The two rear speakers 205 and 206 may be used as woofers that reproduce the sound of low frequency range.

Figure 20:
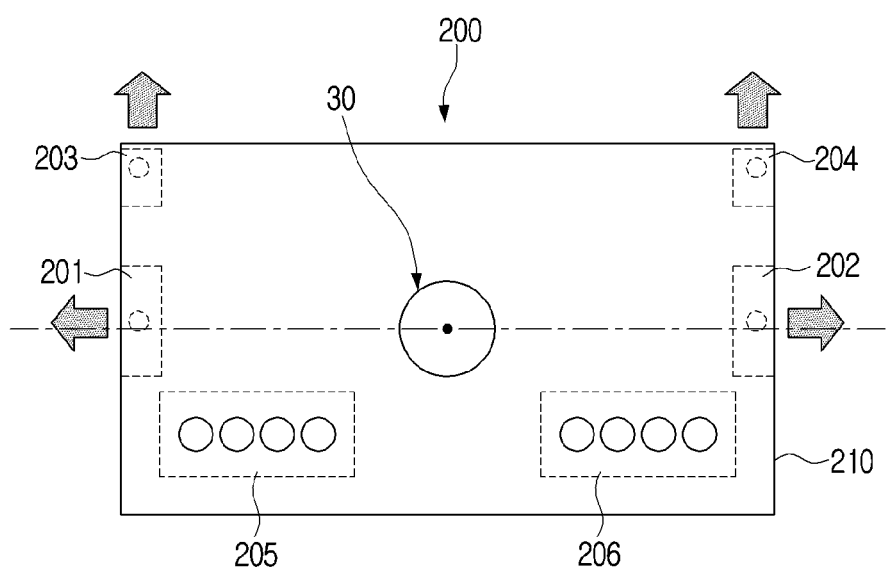
FIG. 20 is a diagram illustrating a state in which a rotating device is disposed on the display apparatus of FIG. 19 according to an embodiment.
Figure 21:
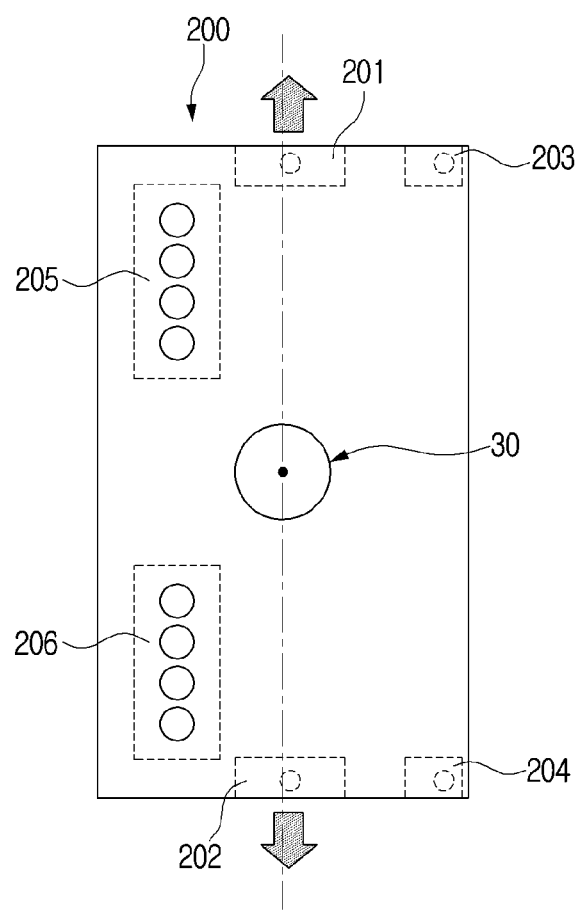
FIG. 21 is a diagram illustrating a state in which the display apparatus of FIG. 20 is rotated 90 degrees to be a vertical arrangement according to an embodiment.

When the rotating device 30 is provided in the display apparatus 200 FIG. 20 is a diagram illustrating a state in which a rotating device is disposed on the display apparatus of FIG. 19 according to an embodiment. FIG. 21 is a diagram illustrating a state in which the display apparatus of FIG. 20 is rotated 90 degrees to be a vertical affangement according to an embodiment.

As illustrated in FIGS. 20 and 21, when the rotating device 30 is disposed on the rear surface of the display panel 210 according to the prior art, the display apparatus 200 according to the prior art may be implemented as a rotatable display apparatus according to an embodiment.

When the display panel 210 is disposed in the horizontal affangement as illustrated in FIG. 20, the stereo and sound image match may be implemented by the left speaker 201, the right speaker 202, and the two upper speakers 203 and 204 like the display apparatus 200 according to the prior art.

When the display panel 210 is disposed in the vertical affangement as illustrated in FIG. 21, in order to match the screen and sound image, the two upper speakers 203 and 204 positioned on the side of the display panel 210 provided in the vertical arrangement are set to reduce the level of the emitted sound or turned off. In addition, the left speaker 201 positioned on the upper side of the display panel 210 provided in the vertical arrangement is set to reproduce a sound of a frequency range lower than a predetermined frequency lower than the maximum frequency that can be reproduced by the right speaker 202 positioned on the lower side, that is, a sound of a mid-low frequency range, such that the screen and the sound image may be matched.

The rotatable display apparatus 1 according to an embodiment may divide a screen, and a plurality of speakers of the rotatable display apparatus 1 may emit sounds to correspond to a plurality of divided screens.

Figure 22A:
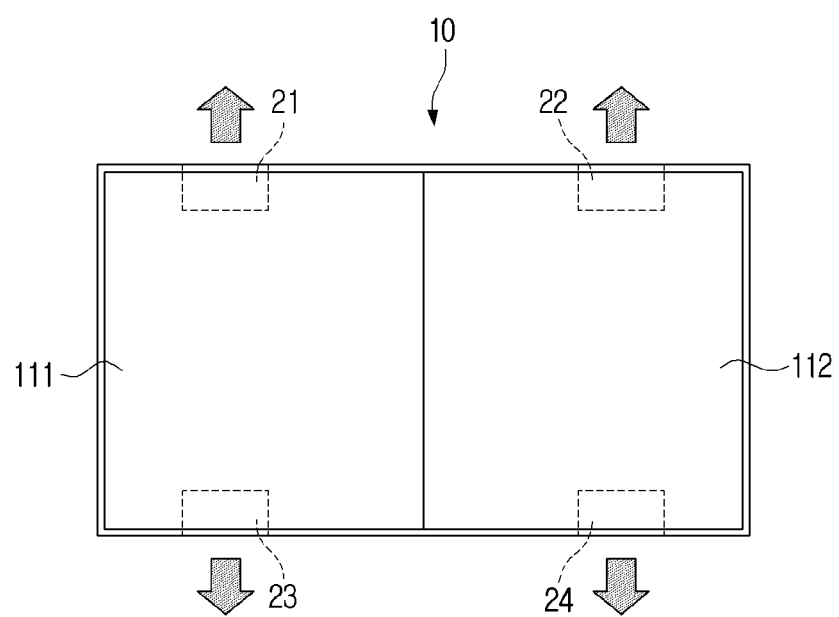
FIG. 22A is a diagram illustrating a state in which a screen of a rotatable display apparatus is divided into two according to an embodiment.

FIG. 22A is a diagram illustrating a state in which a screen of a rotatable display apparatus is divided into two according to an embodiment.

As illustrated in FIG. 22A, the main processor 50 of the display apparatus 1 may divide the screen of the display panel 10 into two, and may display different images on the two divided screens, that is, a first screen 111 and a second screen 112. In addition, the main processor 50 may control the plurality of speakers 21, 22, 23, and 24 to emit sounds coffesponding to the images displayed on the two divided screens 111 and 112.

For example, the main processor 50 may controls the audio signal processor 60 to transmit audio signals coffesponding to the two divided screens 111 and 112 to the plurality of speakers 21, 22, 23, and 24, respectively. In detail, the audio signal processor 60 transmits an audio signal corresponding to the image displayed on the first screen 111 to the first speaker 21 and the third speaker 23 provided adjacent to the first screen 111. Then, the first speaker 21 and the third speaker 23 may emit a sound corresponding to the image of the first screen 111.

In addition, the audio signal processor 60 transmits an audio signal corresponding to the image displayed on the second screen 112 to the second speaker 22 and the fourth speaker 24 provided adjacent to the second screen 112. Then, the second speaker 22 and the fourth speaker 24 may emit a sound corresponding to the image of the second screen 112.

When the display panel 10 is disposed in the vertical arrangement, the divided screens 111 and 112 may correspond to the plurality of speakers 21, 22, 23, and 24.

Figure 22B:
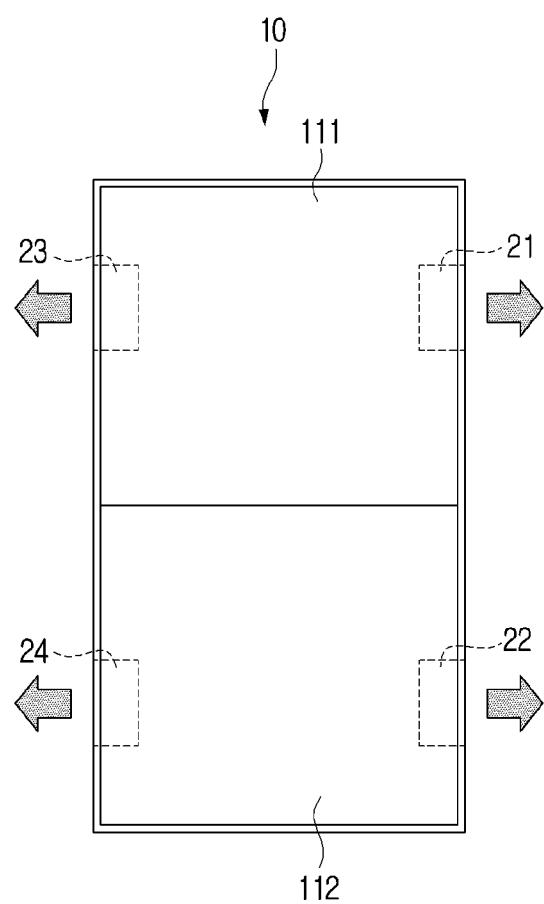
FIG. 22B is a diagram illustrating a state in which the rotatable display apparatus of FIG. 22A is rotated 90 degrees in a clockwise direction to be in a vertical arrangement according to an embodiment.

FIG. 22B is a diagram illustrating a state in which the rotatable display apparatus of FIG. 22A is rotated 90 degrees in a clockwise direction to be in a vertical arrangement according to an embodiment.

When the display panel 10 is disposed in the vertical arrangement, the screen of the display panel 10 may be divided into two vertically. In other words, the first screen 111 is positioned on the upper side of the display panel 10, and the second screen 112 is positioned below the first screen 111.

In this case, the audio signal processor 60 transmits an audio signal corresponding to the image displayed on the first screen 111 to the first speaker 21 and the third speaker 23 provided adjacent to the first screen 111. Then, the first speaker 21 and the third speaker 23 may emit a sound corresponding to the image of the first screen 111.

In addition, the audio signal processor 60 transmits an audio signal corresponding to the image displayed on the second screen 112 to the second speaker 22 and the fourth speaker 24 provided adjacent to the second screen 112. Then, the second speaker 22 and the fourth speaker 24 may emit a sound corresponding to the image of the second screen 112.

The screen of the display apparatus 1 may be divided into four or more screens.

Figure 23A:
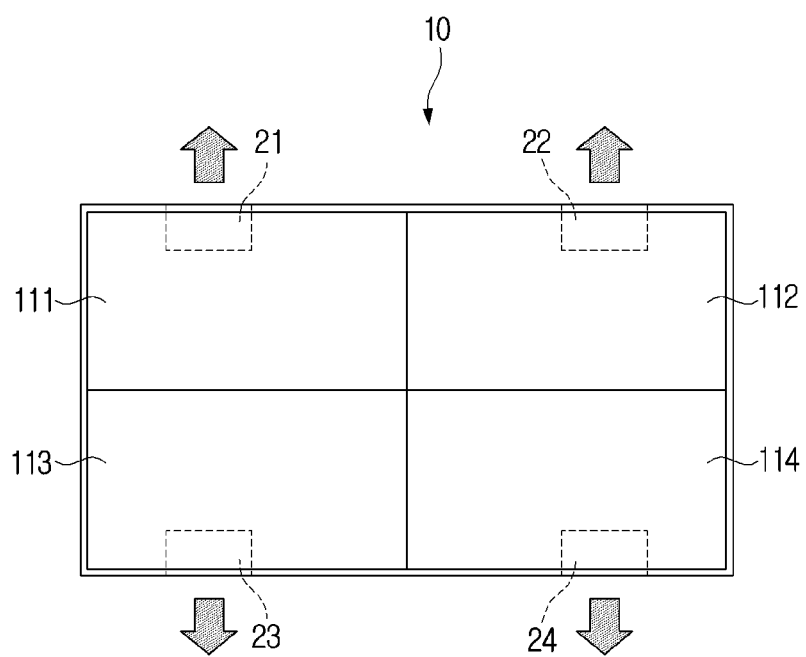
FIG. 23A is a view illustrating a state in which a screen of a rotatable display apparatus is divided into four according to an embodiment.

FIG. 23A is a view illustrating a state in which a screen of a rotatable display apparatus is divided into four according to an embodiment.

As illustrated in FIG. 23A, the main processor 50 of the display apparatus 1 may divide the screen of the display panel 10 into four up, down, left and right, and may display different images on the four divided screens, that is, a first screen 111, a second screen 112, a third screen 113, and a fourth screen 114, respectively. In other words, the first screen 111 may be positioned on the upper left side of the display panel 10, the second screen 112 may be positioned on the upper right side of the display panel 10, the third screen 113 may be positioned on the lower left side of the display panel 10, and the fourth screen 114 may be positioned on the lower right side of the display panel 10.

In addition, the main processor 50 may control the plurality of speakers 21, 22, 23, and 24 to emit sounds corresponding to the images disposed on the four divided screens 111, 112, 113, and 114.

For example, the main processor 50 may controls the audio signal processor 60 to transmit audio signals corresponding to the four divided screens 111, 112, 113, and 114 to the plurality of speakers 21, 22, 23, and 24, respectively. In detail, the audio signal processor 60 transmits an audio signal corresponding to the image displayed on the first screen 111 to the first speaker 21 provided adjacent to the first screen 111, and transmits an audio signal corresponding to the image displayed on the second screen 112 to the second speaker 22 provided adjacent to the second screen 112. Then, the first speaker 21 and the second speaker 22 may emit sounds coffesponding to the images of the first screen 111 and the second screen 112, respectively.

In addition, the audio signal processor 60 transmits an audio signal coffesponding to the image displayed on the third screen 113 to the third speaker 23 provided adjacent to the third screen 113, and transmits an audio signal coffesponding to the image displayed on the fourth screen 114 to the fourth speaker 24 provided adjacent to the fourth screen 114. Then, the third speaker 23 and the fourth speaker 24 may emit sounds corresponding to the images of the third screen 113 and the fourth screen 114, respectively.

When the display panel 10 is disposed in the vertical arrangement, the four divided screens may correspond to the plurality of speaks.

Figure 23B:
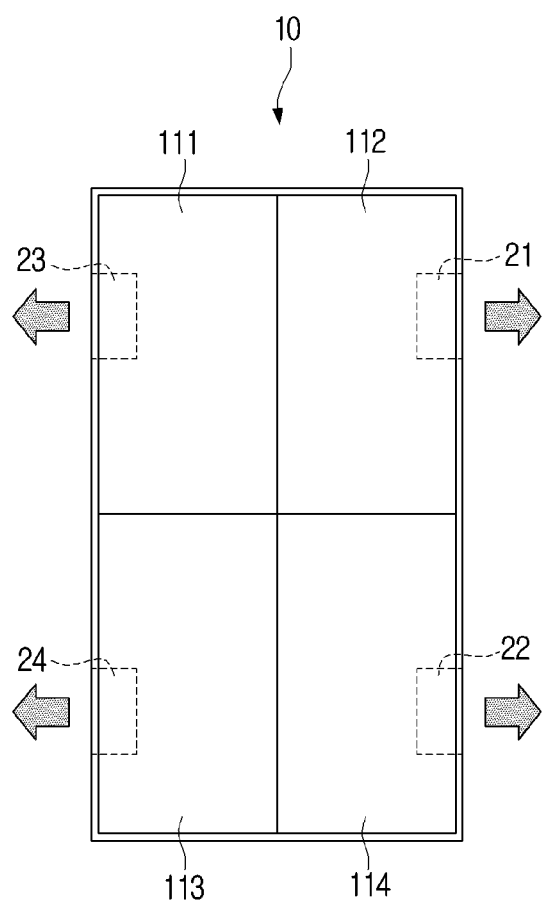
FIG. 23B is a diagram illustrating a state in which the rotatable display apparatus of FIG. 23A is rotated 90 degrees in a clockwise direction to be in a vertical arrangement according to an embodiment.

FIG. 23B is a diagram illustrating a state in which the rotatable display apparatus of FIG. 23A is rotated 90 degrees in a clockwise direction to be in a vertical arrangement according to an embodiment.

When the display panel 10 is disposed in the vertical arrangement, the screen of the display panel 10 may be divided into four, up, down, left and right. In other words, the first screen 111 is positioned on the upper left side of the display panel 10, the second screen 112 is positioned on the upper right side of the display panel 10, the third screen 113 is positioned on the lower left side of the display panel 10, and the fourth screen 114 is positioned on the lower right side of the display panel 10.

In this case, the audio signal processor 60 transmits an audio signal corresponding to the image displayed on the first screen 111 to the third speaker 23 provided adjacent to the first screen 111, and transmits an audio signal corresponding to the image displayed on the second screen 112 to the first speaker 21 provided adjacent to the second screen 112. Then, the third speaker 23 and the first speaker 21 may emit sounds corresponding to the images of the first screen 111 and the second screen 112, respectively.

In addition, the audio signal processor 60 transmits an audio signal corresponding to the image displayed on the third screen 113 to the fourth speaker 24 provided adjacent to the third screen 113, and transmits an audio signal coffesponding to the image displayed on the fourth screen 114 to the second speaker 22 provided adjacent to the fourth screen 114. Then, the fourth speaker 24 and the second speaker 22 may emit sounds coffesponding to the images of the third screen 113 and the fourth screen 114, respectively.

In the above description, a television (TV) has been described as an example of the rotatable display apparatus 1 according to an embodiment, but the display apparatus 1 is not limited thereto. As another example, the rotatable display apparatus according to an embodiment may be applied to a monitor. Alternatively, the rotatable display apparatus according to an embodiment may be applied to a portable display device.

Hereinabove, the disclosure has been described as an illustrative method. It is to be understood that terms used herein are provided to describe the disclosure rather than limiting the disclosure. Various modifications and alternations of the disclosure may be made according to the contents described above. Therefore, the disclosure may be freely practiced without departing from the scope of the claims unless additionally mentioned.

What is claimed is:

1. A rotatable display apparatus comprising:
a display panel having a rectangular shape;
a plurality of speakers provided at an edge of the display panel;
a rotating device provided on a rear surface of the display panel and configured to rotate the display panel;
a panel rotation detector configured to detect a rotation state of the display panel;
an audio signal processor configured to transmit a left audio signal, a right audio signal, and a mixed audio signal to the plurality of speakers based on the rotation state of the display panel; and
a mixer provided in the audio signal processor, the mixer being configured to generate the mixed audio signal by mixing the left audio signal and the right audio signal at a predetermined ratio,
wherein the audio signal processor is further configured to, based on the display panel being inclined:
output the left audio signal to a speaker positioned at a leftmost side among the plurality of speakers,
output the right audio signal to a speaker positioned at a rightmost side among the plurality of speakers, and
output the mixed audio signal to remaining speakers of the plurality of speakers.

2. The rotatable display apparatus of claim 1, wherein the mixer is further configured to determine a mixing ratio of the left audio signal and the right audio signal included in the mixed audio signal based on a rotation angle of the display panel.

3. The rotatable display apparatus of claim 1, wherein the audio signal processor is further configured to, based on the display panel being disposed in a horizontal arrangement or in a vertical arrangement, not transmit the mixed audio signal to the plurality of speakers.

4. The rotatable display apparatus of claim 1, wherein the rotating device is configured to be driven by a motor.

5. The rotatable display apparatus of claim 1, wherein the plurality of speakers are symmetrically provided at an upper portion and a lower portion of the display panel.

6. The rotatable display apparatus of claim 5, wherein the plurality of speakers comprises:
a first speaker provided in an upper surface of the display panel;
a second speaker provided in the upper surface of the display panel;
a third speaker provided in a lower surface of the display panel; and
a fourth speaker provided in the lower surface of the display panel.

7. The rotatable display apparatus of claim 6, wherein the audio signal processor is further configured to, based on the display panel being inclined by rotating the display panel by a predetermined angle in a clockwise direction:
output the left audio signal to the third speaker positioned at the leftmost side,
output the right audio signal to the second speaker positioned at the rightmost side, and
output the mixed audio signal to the first speaker and the fourth speaker.

8. The rotatable display apparatus of claim 5, wherein the plurality of speakers comprises:
a first speaker provided in a left surface of the display panel;
a second speaker provided in the left surface of the display panel;
a third speaker provided in a right surface of the display panel; and
a fourth speaker provided in the right surface of the display panel.

9. The rotatable display apparatus of claim 5, wherein the plurality of speakers comprises:
a first speaker provided in a left surface of the display panel;
a second speaker provided in a right surface of the display panel at a position facing the first speaker;
a third speaker provided in a lower surface of the display panel; and
a fourth speaker provided in an upper surface of the display panel at a position facing the third speaker.

10. The rotatable display apparatus of claim 1, wherein the plurality of speakers are asymmetrically provided at an upper portion and a lower portion of the display panel.

11. The rotatable display apparatus of claim 10, wherein the plurality of speakers comprises:
a left speaker provided in a left surface of the display panel;
a right speaker provided in a right surface of the display panel; and
two lower speakers provided in a lower surface of the display panel.

12. The rotatable display apparatus of claim 11, wherein the audio signal processor is further configured to, based on the display panel being inclined by rotating the display panel by a predetermined angle in a clockwise direction:
transmit an audio signal of a low frequency range to the two lower speakers, and
output the mixed audio signal to the left speaker and the right speaker.

13. The rotatable display apparatus of claim 1, wherein the audio signal processor further comprises a parametric equalizer (PEQ) storage portion configured to store a plurality of PEQ values, and
wherein the audio signal processor is further configured to apply to a different PEQ value to a speaker provided in a lower surface of the display panel among the plurality of speakers based on a rotation angle of the display panel.

14. The rotatable display apparatus of claim 1, wherein the display panel is divided into at least two screens, and
wherein the audio signal processor is further configured to transmit audio signals to the plurality of speakers to correspond to the at least two screens.

15. A display apparatus, comprising:
a display panel;
a plurality of speakers provided on the display panel;
a rotating device provided on the display panel and configured to rotate the display panel;
a panel rotation detector configured to detect a rotation state of the display panel; and
an audio signal processor configured to transmit a mixed audio signal to the plurality of speakers based on the rotation state of the display panel,
wherein the audio signal processor comprises a mixer configured to generate the mixed audio signal by mixing a left audio signal and a right audio signal at a predetermined ratio, and
wherein the audio signal processor is further configured to, based on the display panel being inclined:

output the left audio signal to a leftmost speaker,
output the right audio signal to a rightmost speaker, and
output the mixed audio signal to remaining speakers of the plurality of speakers.

16. The display apparatus of claim 15, wherein the mixer is further configured to determine a mixing ratio of the left audio signal and the right audio signal included in the mixed audio signal based on a rotation angle of the display panel.

17. The display apparatus of claim 15, wherein the audio signal processor is further configured to, based on the display panel being disposed in a horizontal arrangement or in a vertical arrangement, not transmit the mixed audio signal to the plurality of speakers.

18. The display apparatus of claim 15, wherein the rotating device is configured to be driven by a motor.

* * * * *